US009720045B2

(12) United States Patent
Joe et al.

(10) Patent No.: US 9,720,045 B2
(45) Date of Patent: Aug. 1, 2017

(54) APPARATUS AND METHOD FOR ESTIMATING SOC OF SECONDARY BATTERY INCLUDING BLENDED CATHODE MATERIAL

(71) Applicant: LG CHEM, LTD., Seoul (KR)

(72) Inventors: Won-Tae Joe, Daejeon (KR); Sun-Young Cha, Seoul (KR); Geun-Chang Chung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 394 days.

(21) Appl. No.: 14/565,647

(22) Filed: Dec. 10, 2014

(65) Prior Publication Data

US 2015/0137822 A1 May 21, 2015

Related U.S. Application Data

(63) Continuation of application No. PCT/KR2013/002143, filed on Mar. 15, 2013.

(30) Foreign Application Priority Data

Jun. 13, 2012 (KR) ........................ 10-2012-0063332
Mar. 15, 2013 (KR) ........................ 10-2013-0028286

(51) Int. Cl.
| G01N 27/416 | (2006.01) |
| G01R 31/36 | (2006.01) |
| H01M 4/36 | (2006.01) |
| H01M 10/48 | (2006.01) |
| H01M 4/02 | (2006.01) |

(52) U.S. Cl.
CPC ....... *G01R 31/3606* (2013.01); *G01R 31/362* (2013.01); *G01R 31/3648* (2013.01); *H01M 4/364* (2013.01); *H01M 10/48* (2013.01); *G01R 31/3651* (2013.01); *H01M 2004/028* (2013.01)

(58) Field of Classification Search
CPC ........... G01N 27/9046; G01N 27/9093; G01N 27/9013; G01N 27/82; B61K 9/10; G01R 31/3658
USPC ...................................................... 324/426
See application file for complete search history.

(56) References Cited

U.S. PATENT DOCUMENTS

| 6,134,457 A | 10/2000 | Ha et al. | |
| 2002/0097065 A1* | 7/2002 | Krahn ................. | G01R 31/343 324/765.01 |
| 2002/0179890 A1* | 12/2002 | Sletson ................ | H01G 4/221 252/570 |
| 2003/0112011 A1* | 6/2003 | Guiheen ............ | G01R 31/3624 324/429 |
| 2004/0257087 A1 | 12/2004 | Murakami | |
| 2008/0091363 A1* | 4/2008 | Lim ...................... | H02J 7/0029 702/63 |
| 2011/0161025 A1* | 6/2011 | Tomura .............. | G01R 31/3651 702/63 |
| 2011/0316548 A1 | 12/2011 | Ghantous et al. | |
| 2012/0274331 A1* | 11/2012 | Liu ...................... | G01R 31/362 324/426 |
| 2013/0187082 A1 | 7/2013 | Choi et al. | |
| 2014/0021959 A1* | 1/2014 | Maluf ................. | G01R 31/3637 324/430 |
| 2014/0349146 A1* | 11/2014 | Dittmann ............. | H02J 7/0016 429/50 |

FOREIGN PATENT DOCUMENTS

| DE | 10 2009 029 347 A1 | 3/2011 |
| EP | 1 251 359 A1 | 10/2002 |
| EP | 1 972 955 A1 | 9/2008 |
| JP | 2001-313088 A | 11/2001 |
| JP | 2003-151645 A | 5/2003 |
| JP | 2003-307557 A | 10/2003 |
| JP | 2007-166789 A | 6/2007 |
| JP | 2012-94395 A | 5/2012 |
| KR | 2001-0082115 A | 8/2001 |
| KR | 10-2004-0060921 A | 7/2004 |
| KR | 10-2010-0019660 A | 2/2010 |
| KR | 10-1147602 B1 | 5/2012 |

OTHER PUBLICATIONS

International Search Report, issued in PCT/KR2013/002143, dated Jun. 27, 2013.
Written Opinion of the International Searching Authority, issued in PCT/KR2013/002143, dated Jun. 27, 2013.

* cited by examiner

*Primary Examiner* — Arun Williams
(74) *Attorney, Agent, or Firm* — Birch, Stewart, Kolasch & Birch, LLP

(57) ABSTRACT

Disclosed is an apparatus and method for estimating a SOC of a secondary battery containing a blended cathode material. The SOC estimating apparatus estimates a SOC of a secondary battery including a cathode having a blended cathode material containing a first cathode material and a second cathode material with different operating voltage ranges, an anode having an anode material, and a separator for separating the cathode from the anode, and the apparatus includes a sensor configured to measure a discharge inception voltage and a final discharge voltage when the secondary battery is discharged for a predetermined time, and a control unit configured to estimate SOC of the secondary battery corresponding to the measured discharge inception voltage and the measured final discharge voltage by using a predetermined relationship between the discharge inception voltage and the final discharge voltage and the SOC of the secondary battery.

32 Claims, 9 Drawing Sheets

APPARATUS AND METHOD FOR ESTIMATING SOC OF SECONDARY BATTERY INCLUDING BLENDED CATHODE MATERIAL

CROSS-REFERENCE TO RELATED APPLICATION

The present application is a continuation of International Application No. PCT/KR2013/002143 filed on Mar. 15, 2013, which claims priority to Korean Patent Application No. 10-2012-0063332 filed on Jun. 13, 2012, and Korean Patent Application No. 10-2013-0028286 filed on Mar. 15, 2013, in the Republic of Korea, the disclosures of which are incorporated herein by reference.

TECHNICAL FIELD

The present disclosure relates to a method and apparatus for estimating a SOC of a secondary battery.

BACKGROUND ART

A battery generates electric energy by oxidation and reduction reactions and is widely used in various ways. For example, a battery is applied to portable devices such as cellular phones, laptops, digital cameras, video cameras, tablet computers, and electric tools; electric-driven apparatuses such as electric bikes, motor cycles, electric vehicles, hybrid vehicles, electric ships, and electric airplanes; power storage devices used for storing power generated by new regeneration energy or surplus energy of a power plant; uninterrupted power supplies for stably supplying power to various information communication devices such as server computers and base stations for communication, and so on.

A battery includes three basic components: an anode containing material which is oxidized while emitting electrons during discharge, a cathode containing material which is reduced while accepting electrons during discharge, and an electrolyte allowing the transfer of operating ions between the anode and the cathode.

Batteries may be classified into primary batteries which are not reusable after discharge, and secondary batteries which allow repeated charge and discharge since their electrochemical reaction is at least partially reversible.

The secondary batteries include lead-acid batteries, nickel-cadmium batteries, nickel-zinc batteries, nickel-iron batteries, silver oxide batteries, nickel metal hydride batteries, zinc-manganese oxide batteries, zinc-bromide batteries, metal-air batteries, lithium secondary batteries and so on, as well known in the art. Among them, lithium secondary batteries are drawing the most attention due to their high energy density, high battery voltage and long life cycle in comparison to other secondary batteries.

In the lithium secondary battery, the material used as the cathode material greatly influences the performance of the secondary battery. Therefore, various attempts are being made to provide cathode materials having high-temperature stability, large energy capacity, long life span and low production costs.

DISCLOSURE

Technical Problem

The present disclosure is directed to providing a blended cathode material, which may remedy shortcomings of individual cathode materials by blending at least two kinds of cathode materials, and an apparatus and method for estimating a SOC of a secondary battery including the blended cathode material.

Technical Solution

In one aspect of the present disclosure, there is provided an apparatus for estimating a state of charge (SOC) of a secondary battery, which includes a cathode having a blended cathode material containing a first cathode material and a second cathode material with different operating voltage ranges, an anode having an anode material, and a separator for separating the cathode from the anode, the apparatus including: a sensor for measuring a discharge inception voltage and a final discharge voltage when the secondary battery is discharged for a predetermined time; and a control unit for estimating a SOC of the secondary battery corresponding to the measured discharge inception voltage and the measured final discharge voltage by using a predetermined relationship between the discharge inception voltage and the final discharge voltage of the secondary battery and the SOC.

In an embodiment, the discharge inception voltage may be a voltage measured right after the secondary battery in a no-load state comes to a key-on state, and the final discharge voltage may be a voltage measured after the secondary battery in the key-on state performs key-on discharge for a predetermined time. Hereinafter, the former voltage will be called a key-on voltage, and the latter voltage will be called a key-on discharge voltage. In addition, the discharge of the secondary battery in a key-on state will be called key-on discharge. The key-on point may be before the voltage of the secondary battery in a no-load state reaches an equilibrium state voltage.

When the secondary battery is in a no-load state, the SOC of the secondary battery may fall within a range which causes a voltage relaxation phenomenon by transferring operating ions between the first cathode material and the second cathode material. In this case, while the secondary battery is in a no-load state, the voltage of the secondary battery may be gradually changed until reaching the equilibrium state voltage while following a voltage relaxation profile determined by the SOC.

The voltage relaxation profile may have an inflection point and be shaped to have a curvature varying based on the inflection point. The equilibrium state voltage represents a voltage when the secondary battery is electrochemically stable and thus the voltage does not substantially change and may correspond to an open circuit voltage. The time taken for the voltage of the secondary battery to reach the equilibrium state voltage may vary from several ten seconds to several hours depending on the SOC of the secondary battery, the temperature of the secondary battery or the like.

The key-on discharge means a charge caused while the secondary battery is electrically connected to a load when the secondary battery comes into a key-on state.

In an embodiment, a pre-charge condenser may be interposed between the secondary battery and the load. The pre-charge condenser is connected between the secondary battery and the load in parallel, and when the secondary battery is connected to the load, the pre-charge condenser prevents a rush current from being applied to the load.

If the key-on discharge is performed, the pre-charge condenser is charged, and if the pre-charge condenser completes charging, a discharge current flows from the secondary battery to the load.

In the related art, the key-on discharge is called precharging.

If the key-on discharge occurs, a weak discharge current (e.g., lower than 1 c) flows from the secondary battery to the load. In addition, the key-on discharge is maintained for a short time, for example several seconds to several ten seconds. If the key-on discharge is caused, the voltage of the secondary battery is lowered from the key-on voltage for a short time, returns to the voltage relaxation profile and varies according to the voltage relaxation profile.

The key-on discharge voltage is a voltage measured at a predetermined point in the voltage change pattern shown after the voltage of the secondary battery drops during the key-on discharge until the voltage of the secondary battery returns to the voltage relaxation profile.

For example, the key-on discharge voltage may be a voltage measured a predetermined time (e.g., 10 seconds) after the key-on discharge is initiated. As another example, the key-on discharge voltage may be a voltage a predetermined time (e.g., 5 seconds) after the key-on discharge is completed. As another example, the key-on discharge voltage may also be a voltage measured when the voltage variation of the secondary battery caused by the key-on discharge ends (namely, when the voltage of the secondary battery returns to the voltage relaxation profile). As another example, the key-on discharge voltage may be a voltage measured when a minimum point is formed in a voltage change pattern of the secondary battery formed by the key-on discharge. As another example, the key-on discharge voltage may be a voltage measured when a voltage variation per unit time is greatest in the voltage change pattern of the secondary battery formed by the key-on discharge.

The operating ion means an ion electrochemically reacting with the first and second cathode materials while the secondary battery is charged or discharged. The operating ion may vary depending on the kind of the secondary battery. For example, in case of a lithium secondary battery, the operating ion may be a lithium ion.

The reaction represents an electrochemical reaction including oxidation and reduction reactions of the first and second cathode materials, accompanied by the charging or discharging process of the secondary battery, and may vary depending on the operating mechanism of the secondary battery. For example, the electrochemical reaction may mean that an operating ion is intercalated into or deintercalated from the first cathode material and/or the second cathode material. In this case, the concentration of the operating ion intercalated into or deintercalated from the first and/or second cathode material may vary according to the change of the voltage of the secondary battery, and as a result the first and second cathode materials may have different operating voltage ranges. For example, in a certain voltage range, the operating ion may be preferentially intercalated into the first cathode material in comparison to the second cathode material, and in another voltage range, the operating ion may be preferentially intercalated into the second cathode material in comparison to the first cathode material. In addition, in a certain voltage range, the operating ion may be preferentially deintercalated from the second cathode material in comparison to the first cathode material, and in another voltage range, the operating ion may be preferentially deintercalated from the first cathode material in comparison to the second cathode material.

In an embodiment, in order to satisfy the condition that the concentration of operating ions reacting with the first and second cathode materials vary according to the voltage, the first and second cathode materials may meet at least one of the following conditions.

For example, when dQ/dV distribution of each cathode material is measured, the first and second cathode materials may be different in locations and/or intensities of main peaks appearing in the dQ/dV distribution.

Here, the dQ/dV distribution represents a capacity characteristic of the cathode material at each voltage at to the operating ion. The difference in locations and/or intensities of the main peaks may be changed depending on the kinds of the first and second cathode materials.

In another embodiment, when measuring a discharge resistance of the lithium secondary battery containing the first and second cathode materials at each SOC, the discharge resistance profile may have a convex pattern.

Here, SOC represents an amount of electric energy stored in the secondary battery and is known as a parameter of the State Of Charge. The SOC may be quantitatively expressed by using parameters of SOC and z. When the SOC is expressed in percentage, the SOC parameter is used, and when the SOC is expressed as a value not greater than 1, the z parameter is used. The SOC may be measured by means of ampere counting, without being limited thereto.

In another example, when a discharge resistance of the secondary battery containing the first and second cathode materials for each SOC is measured, the discharge resistance profile may have at least two inflection points before and after the convex pattern.

In another example, the open circuit voltage profile of the secondary battery containing the first and second cathode materials may have at least one voltage plateau. Here, the voltage plateau means a region where an inflection point exists and the curvature of the profile is changed before or after the inflection point.

In another example, at least one of the first and second cathode materials may have a voltage profile with a voltage plateau.

In an embodiment, the first cathode material may be an alkali metal compound expressed by a general chemical formula $A[A_xM_y]O_{2+z}$ (A includes at least one of Li, Na and K; M includes at least one element selected from the group consisting of Ni, Co, Mn, Ca, Mg, Al, Ti, Si, Fe, Mo, V, Zr, Zn, Cu, Mo, Sc, Zr, Ru and Cr; $x \geq 0$, $1 \leq x+y \leq 2$, $-0.1 \leq z \leq 2$; and x, y, z and stoichiometric coefficients of the components included in M are selected so that the compound maintains electrically neutral).

Optionally, the first cathode material may be an alkali metal compound expressed by $xLiM^1O_2\text{-}(1\text{-}x)Li_2M^2O_3$ wherein $M^1$ includes at least one element with an average oxidation state of +3; $M^2$ includes at least one element with an average oxidation state of +4; and $0 \leq x \leq 1$, which is disclosed in U.S. Pat. Nos. 6,677,082, 6,680,143 or the like.

In another embodiment, the second cathode material may be lithium metal phosphate expressed by a general chemical formula $Li_aM^1_xFe_{1-x}M^2_yP_{1-y}M^3_zO_{4-z}$ ($M^1$ is at least one element selected from the group consisting of Ti, Si, Mn, Co, V, Cr, Mo, Fe, V, Cr, Mo, Ni, Nd, Mg and Al; $M^2$ is at least one element selected from the group consisting of Ti, Si, Mn, Co, V, Cr, Mo, Fe, Ni, Nd, Mg, Al, As, Sb, Si, Ge, V and S; $M^3$ is at least one element of a halogen group selectively containing F; $0<a\leq 2$, $0\leq x\leq 1$, $0\leq y<1$, $0\leq z<1$; and a, x, y, z, and stoichiometric coefficients of the components included in $M^1$, $M^2$, and $M^3$ are selected so that the compound maintains electrically neutral) or $Li_3M_2(PO_4)_3$ [M is at least one element selected from the group consisting of Ti, Si, Mn, Fe, Co, V, Cr, Mo, Ni, Mg and Al].

In another embodiment, the first cathode material may be an alkali metal compound expressed by Li[Li$_a$Ni$_b$Co$_c$Mn$_d$]O$_{2+z}$ (a≥0; a+b+c+d=1; at least one of b, c and d is not zero; −0.1≤z≤2). In addition, the second cathode material may be at least one selected from the group consisting of LiFePO$_4$, LiMn$_x$Fe$_y$PO$_4$ (0<x+y≤1) and Li$_3$Fe$_2$(PO$_4$)$_3$.

In another embodiment, the first cathode material and/or the second cathode material may include a coating layer. The coating layer may include a carbon layer, or an oxide layer or a fluoride layer containing at least one selected from the group consisting of Ti, Si, Mn, Co, V, Cr, Mo, Fe, Ni, Nd, Mg, Al, As, Sb, Si, Ge, V and S.

In the present disclosure, a blending ratio of the first and second cathode materials may be suitably adjusted according to an electrochemical design condition considering the use of a secondary battery to be manufactured.

In addition, the number of cathode materials capable of being included in the blended cathode material is not limited to two. In an embodiment, the blended cathode material may include three kinds of cathode materials different from each other, for example a blended cathode material including LiMn$_2$O$_4$, Li[Li$_a$Ni$_x$Co$_y$Mn$_z$]O$_2$ [a≥0; a+x+y+z=1; at least one of x, y and z is not zero] and LiFePO$_4$. In another embodiment, the blended cathode material may have four kinds of cathode materials different from each other, for example a blended cathode material including LiNiO$_2$, LiMn$_2$O$_4$, Li[Li$_a$Ni$_x$Co$_y$Mn$_z$]O$_2$ [a≥0; a+x+y+z=1; at least one of x, y and z is not zero] and LiFePO$_4$. In addition, in order to improve properties of the blended cathode material, other additives such as a conducting agent and a binder may be added to the blended cathode material without special restriction.

In an embodiment of the present disclosure, the predetermined relationship may be a look-up table in which a relationship between the key-on voltage and the key-on discharge voltage of the secondary battery and the SOC is predetermined.

In another embodiment of the present disclosure, the predetermined relationship may be a look-up function which uses the key-on voltage and the key-on discharge voltage as input parameters and the SOC as an output parameter.

In the present disclosure, the relationship may be predefined by applying the same discharge condition as the key-on discharge. In an embodiment, the key-on discharge may be a constant current discharge. In addition, the key-on discharge may be automatically performed when the secondary battery comes into a key-on state.

The SOC estimating apparatus according to the present disclosure may further include a storage unit in which the look-up table and/or the look-up function is stored.

The SOC estimating apparatus according to the present disclosure may further include a discharge unit which may be selectively connected to the secondary battery, and the control unit may connect the discharge unit and the secondary battery for several seconds or several ten seconds for the purpose of the key-on discharge.

The SOC estimating apparatus according to the present disclosure may further include a display unit for displaying the estimated SOC as a graphic interface, and the control unit may output the estimated SOC on the display unit.

The SOC estimating apparatus according to the present disclosure may further include a storage unit storing the estimated SOC, and the control unit may store the estimated SOC in the storage unit.

In the present disclosure, the control unit may output the estimated SOC to the outside.

In another aspect of the present disclosure, there is also provided a method for estimating SOC of a secondary battery, which includes a cathode having a blended cathode material containing a first cathode material and a second cathode material with different operating voltage ranges, an anode having an anode material, and a separator for separating the cathode from the anode, the method including: measuring a discharge inception voltage and a final discharge voltage when the secondary battery is discharged for a predetermined time; and estimating SOC of the secondary battery corresponding to the measured discharge inception voltage and the measured final discharge voltage by using a predetermined relationship between the discharge inception voltage and the final discharge voltage of the secondary battery and the SOC.

Preferably, the discharge inception voltage may be a key-on voltage measured just after the secondary battery shifts from a no-load state to a key-on state, and the final discharge voltage may be a key-on discharge voltage measured when the discharge is completed in the case where the secondary battery is discharged in the key-on state for a predetermined time.

The method for estimating SOC of a secondary battery according to the present disclosure may include displaying the estimated SOC as a graphic interface, and/or storing the estimated SOC, and/or outputting the estimated SOC to the outside.

The apparatus and method for estimating SOC of a secondary battery according to the present disclosure may be applied to estimate a SOC of a secondary battery loaded on various kinds of electric-driven apparatuses which may operate by electric energy.

In an embodiment, the electric-driven apparatus may be a mobile computer device such as a cellular phone, a laptop, and a tablet computer; or a hand-held multimedia device such as a digital camera, a video camera, and an audio/video regenerating device.

In another embodiment, the electric-driven apparatus may be an electric-powered apparatus such as an electric vehicle, a hybrid vehicle, an electric bike, a motor cycle, an electric train, an electric ship, and an electric airplane; or a motor-mounted power tool such as an electric drill and an electric grinder.

In another embodiment, the electric-driven apparatus may be a large power storage device installed at a power grid to store new regeneration energy or surplus energy of a power plant, or an uninterrupted power supply for supplying power to various information communication devices such as server computers and mobile communication devices in times of emergency such as a blackout.

Advantageous Effects

According to an aspect of the present disclosure, when an electric-driven apparatus on which a secondary battery including a blended cathode material is loaded comes to a key-on state, even though the secondary battery exhibits an unusual voltage behavior, a SOC of the secondary battery may be reliably estimated by using a key-on voltage and a key-on discharge voltage.

According to another aspect of the present disclosure, since the SOC of the secondary battery including the blended cathode material may be reliably measured, cathode materials, which were not capable of being blended due to distinctive voltage behaviors, may be blended into various combinations. Therefore, by selecting two or more cathode materials among various kinds of available cathode materials and blending them into various combinations according to the usage of a secondary battery, it is possible to provide a blended cathode material most appropriately optimized for the usage of the secondary battery.

DESCRIPTION OF DRAWINGS

The accompanying drawing illustrates a preferred embodiment of the present disclosure and together with the foregoing disclosure, serves to provide further understanding of the technical spirit of the present disclosure. However, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

The embodiments described below are based on cases where the present disclosure is applied to a lithium secondary battery. Here, the lithium secondary battery is a general name of a secondary battery where lithium ions serve as operating ions during charge and discharge to cause electrochemical reactions at a cathode and an anode. The operating ions mean ions participating in electrochemical oxidizing and reducing reactions while the secondary battery is charged or discharged, and may be, for example, lithium. Therefore, even though secondary batteries are called differently according to the kind of electrolyte or separator used in the lithium secondary battery, the kind of package used for packing the secondary battery, or the internal or external structure of the lithium secondary battery, such secondary batteries should be interpreted as being included in the scope of the lithium secondary battery if lithium ions are used as operating ions.

In addition, the present disclosure may also be applied to various kinds of secondary batteries other than the lithium secondary batteries. Therefore, all kinds of secondary batteries should be interpreted as being included in the scope of the present disclosure if the spirit of the present disclosure may be applied even though their operating ion is not a lithium ion.

Moreover, the number of its components used in the secondary battery is not specially limited. Therefore, the secondary battery should be interpreted as including a unit cell having an anode, an electrolyte and a cathode as a basic unit, an assembly of unit cells, a module having a plurality of assemblies connected in series and/or in parallel, a pack having a plurality of modules connected in series and/or in parallel, a battery system having a plurality of packs connected in series and/or in parallel, or the like.

Figure 1:
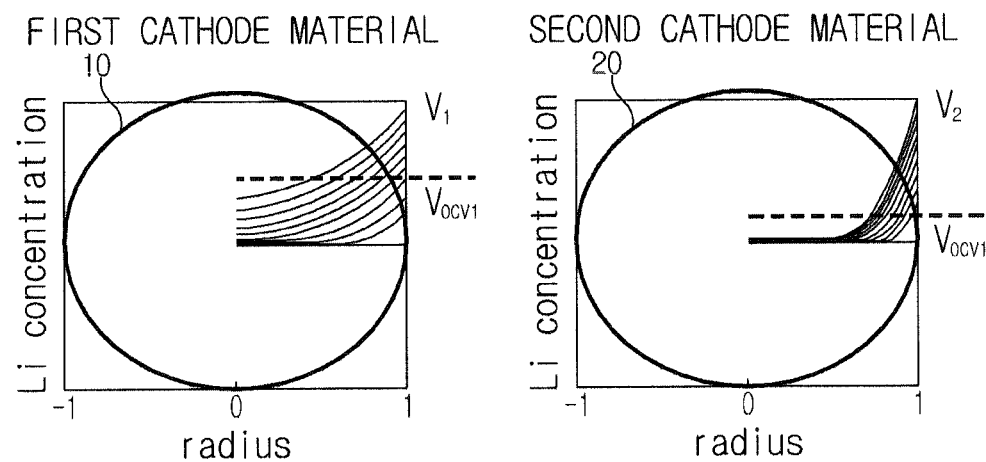
FIG. 1 is a diagram for illustrating a voltage relaxation phenomenon occurring in a secondary battery having a blended cathode material.

FIG. 1 is a diagram for illustrating a voltage relaxation phenomenon occurring in a secondary battery including a blended cathode material. In detail, FIG. 1 depicts that a voltage relaxation occurs between cathode materials when a secondary battery including a blended cathode material, where two cathode materials having different degrees of reaction with lithium ions serving as operating ions of a lithium secondary battery (namely, having different operating voltage ranges) are blended, is discharged and comes to a no-load state while being discharged.

As shown in FIG. 1, while the lithium secondary battery is discharged, lithium ions electrochemically react with a first cathode material 10 and a second cathode material 20. The electrochemical reaction means that the lithium ions are intercalated into the first and second cathode materials 10, 20 or deintercalated therefrom. The electrochemical reaction may be varied according to an operating mechanism of the lithium secondary battery.

The first and second cathode materials 10, 20 have different reaction concentrations of lithium ions reacting therewith according to the change of voltage. In other words, the first and second cathode materials 10, 20 have different operating voltage ranges. For example, under the condition where the secondary battery is discharged, in a certain voltage range, lithium ions may be preferentially intercalated into the first cathode material 10 rather than the second cathode material 20, and at another voltage range, it may be the opposite. As another example, under the condition where the lithium secondary battery is charged, in a certain voltage range, operating ions may be preferentially deintercalated from the second cathode material 20 rather than the first cathode material 10, and at another voltage range, it may be the opposite.

FIG. 1 shows an example where the concentration of lithium ions reacting with the first cathode material 10 is greater than the concentration of lithium ions reacting with the second cathode material 20 when the lithium secondary battery is discharged. If the voltage of the lithium secondary battery varies, the reaction concentrations of lithium ions reacting with the first and second cathode materials 10, 20 may be reversed.

The lithium ions intercalated into the first and second cathode materials 10, 20 diffuse into the cathode materials, and in this process, a lithium ion concentration deviation occurs near and in the surface of the cathode materials. The black solid lines represent the change of lithium concentration inside the cathode materials or near their surfaces, and it may be understood that the concentration of lithium ions is greater near the surface than the inside of the first and second cathode materials 10, 20 in both cases, and the concentration of lithium ions gets smaller from the vicinity of the surface to the inside.

The voltage of the secondary battery measured when the lithium secondary battery is discharged is generally determined by the concentration of lithium ions present near the surface of the cathode material. In addition, in view of electric potential, when the lithium secondary battery is in a discharge mode, surface potentials $V_1$, $V_2$ of the first and second cathode materials 10, 20 have no significant difference. In the art, the voltage measured when a lithium secondary battery is discharged is called a dynamic voltage.

Meanwhile, if the lithium secondary battery comes to a no-load state, the reaction of the first and second cathode materials 10, 20 with lithium ions stops, and lithium ions are diffused in the first and second cathode materials 10, 20 due to the deviation of lithium ion concentration. Therefore, if the no-load state is maintained for a predetermined time, the voltage of the lithium secondary battery is determined according to the average concentration of lithium ions present in the first and second cathode materials 10, 20. Further, in view point of electric potential, the potential $V_{OCV1}$ of the first cathode material 10 marked by a dotted line becomes higher than the potential $V_{OCV2}$ of the second cathode material 20 marked by a dotted line, and the difference between the potentials $V_{OCV1}$ and $V_{OCV2}$ increases as the no-load state is maintained longer. Hereinafter, the voltage measured when the secondary battery comes to a no-load state is called a no-load voltage.

In the present disclosure, the no-load state means a state where the secondary battery stops charging or discharging and so the capacity of the secondary battery is substantially not changing or the change is negligible. For example, when an electric vehicle driven by electric energy stops at a traffic signal for a while or when an information communication device does not operate over a predetermined time without turning off, the secondary battery included in the electric vehicle or the information communication device may be regarded as coming to a no-load state.

As an example of the no-load state, a minute current (for example, lower than 0.5 c-rate) may flow out from the secondary battery in order to provide a minimal power required by electronic components, for example a microprocessor, other than a main load included in a device on which the secondary battery is loaded. Here, the main load may be a motor, a power conversion circuit or the like. The no-load state means a state in which an electric current does substantially not flow to a main load of a device on which the secondary battery is loaded. Therefore, it should be understood that a state in which a minute current flows from the secondary battery to electronic components other than a main load may also be regarded as the no-load state.

As described above, if the potentials $V_{OCV1}$ and $V_{OCV2}$ of the first and second cathode materials 10, 20 are different in the condition that the lithium secondary battery is in the no-load state, a potential difference is generated between the first and second cathode materials 10, 20, and if the potential difference increases so much to cause the transfer of lithium ions, lithium ions start to move from the second cathode material 20 to the first cathode material 10. If lithium ions move between the cathode materials, the potential of the second cathode material 20 giving lithium ions increases, and the potential of the first cathode material 10 receiving lithium ions decreases. The second cathode material 20 is charged (the potential increases) as lithium ions escape, and the first cathode material 10 is discharged (the potential decreases) as lithium ions are intercalated. If lithium ions move between the first and second cathode materials 10, 20 as described above, the potential difference between the first and second cathode materials 10, 20 slowly decreases, and at an equilibrium state where lithium ions no longer move further, the first and second cathode materials 10, 20 have identical potential.

In the present disclosure, the concept 'voltage relaxation' may be defined by peculiar electrochemical behaviors of the blended cathode material as described above. In other words, the 'voltage relaxation' may be defined as a following phenomenon: when a lithium secondary battery in a discharge mode comes to a no-load state, lithium ions are diffused in the first and second cathode materials 10, 20 included in the blended cathode material, the diffused lithium ions cause a potential difference between the first and second cathode materials 10, 20, and the potential difference causes transfer of lithium ions between the cathode materials, thereby slowly decreasing the potential difference.

The voltage relaxation phenomenon is generated in a partial voltage range, not in the entire voltage range where a lithium secondary battery having the blended cathode material is discharged. In other words, when the lithium secondary battery comes to a no-load state while being discharged in the partial voltage range, the voltage relaxation phenomenon is generated. The partial voltage range may be changed according to various factors such as the kind or blending ratio of the first and second cathode materials 10, 20, an magnitude of a discharge current, and a state of charge (SOC) of the secondary when the secondary battery comes to the no-load state, but in view of the blended cathode material, the partial voltage range corresponds to an inherent voltage range of each blended cathode material. Therefore, the partial voltage range where the voltage relaxation phenomenon occurs will be called an 'intrinsic voltage range'.

If the lithium secondary battery is discharged in the intrinsic voltage range, among the first and second cathode materials 10, 20, the first cathode material 10 easily reacting with lithium ions is almost completely reacted with lithium ions. Therefore, in view of lithium ions, it is difficult to react with the first cathode material 10. In other words, if a dynamic voltage is within the intrinsic voltage range while the lithium secondary battery is being discharged, the resistance of the first cathode material 10 rapidly increases, and as a result the resistance of the second cathode material 20 relatively decreases in comparison to the first cathode material 10. Therefore, lithium ions react with the second cathode material 20 having relatively low resistance and start being intercalated into the second cathode material 20. If this situation is maintained for a predetermined time and then the lithium secondary battery comes to a no-load state when the concentration of lithium ions mainly present near the surface of the second cathode material 20 increases to some extent, the voltage relaxation phenomenon described above occurs. In other words, the voltage relaxation phenomenon may be regarded as occurring if the lithium secondary battery comes to the no-load state at an early stage where most of the capacity of the first cathode material 10 for intercalation of lithium ions is exhausted and the second cathode material 20 starts reacting with lithium ions.

Figure 2:
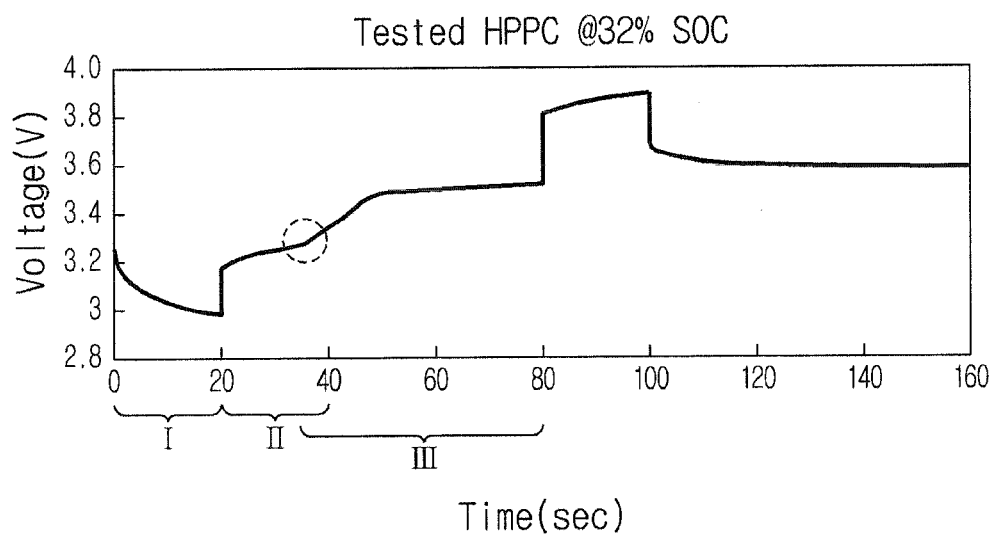
FIG. 2 is a graph showing a voltage change pattern of a secondary battery when the secondary battery comes to a no-load state in an intrinsic voltage range where voltage relaxation occurs.

FIG. 2 is a graph showing the pattern of no-load voltage changing according to time when a lithium secondary battery including a blended cathode material where a lithium transition metal oxide $LiNi_aCo_bMn_cO_2$ (a=b=c=⅓; hereinafter, referred to as an NMC cathode material) having a layered structure as the first cathode material and $LiFePO_4$ (referred to as an LFP cathode material) having an olivine structure as the second cathode material are blended at a ratio of 7:3 (weight ratio) comes to a no-load state while being discharged from 3.2V (SOC 32%) belonging to the intrinsic voltage range near to 3V.

Referring to FIG. 2, the changing pattern of the no-load voltage of the lithium secondary battery may be classified into first to third regions (I, II and III).

In the first region (I), a dynamic voltage of a lithium secondary battery having a voltage of 3.2V (SOC 32%) slowly decreases while the lithium secondary battery is being discharged near to 3V. If the lithium secondary battery has a dynamic voltage of 3.2V, the capacity of the first cathode material does not have much room for intercalation of lithium ions. Therefore, if the lithium secondary battery is discharged from 3.2V to 3.0V, the lithium ions mostly react with the second cathode material rather than with the first cathode material, and so the concentration of lithium ions near the surface of the second cathode material increases.

In the second region (II), the lithium secondary battery comes to a no-load state while discharging stops near 3.0V, and the no-load voltage of the lithium secondary battery slowly increases as lithium ions are diffused in the first and second cathode materials of the blended cathode material.

Meanwhile, at a border of the first region (I) and the second region (II), the no-load voltage of the lithium secondary battery rapidly increases because an IR drop voltage substantially becomes 0 (zero) as the lithium secondary battery stops discharging. In other words, if the lithium secondary battery stops discharging, a voltage drop caused by the IR drop phenomenon disappears, and the no-load voltage of the lithium secondary battery rapidly increases as much as the IR voltage drop.

In the third region (III), as lithium ions are diffused in the first and second cathode materials, a potential difference is generated between the cathode materials, operating ions are transferred between the cathode materials due to the generated potential difference to cause a voltage relaxation phenomenon, and as the voltage relaxation of the cathode materials progresses, the no-load voltage of the lithium secondary battery slowly increases near to 3.5V corresponding to an equilibrium voltage. Here, the equilibrium voltage means a voltage when the voltage change by a voltage relaxation phenomenon substantially ends, and substantially corresponds to an open circuit voltage of the lithium secondary battery.

Meanwhile, the second region (II) and the third region (III) are represented to partially overlap each other since operating ions causing voltage relaxation between the cathode materials start transferring before lithium ions are 'completely' diffused in the cathode materials (namely, before the second region ends) and so a border between the second region (II) and the third region (III) may not be clearly distinguished.

In FIG. 2, it should be noted that an inflection point (marked with a dotted circle) is present between the second region (II) and the third region (III). This supports that a dominating electrochemical mechanism causing the increase of a no-load voltage changes before and after the appearance of the inflection point, while the no-load voltage of the lithium secondary battery increases to 3.5V corresponding to the equilibrium voltage after the lithium secondary battery stops discharging. Here, the term 'dominating' means that a certain electrochemical mechanism is superior to other electrochemical mechanisms. In other words, it may be regarded that the no-load voltage of the lithium secondary battery generally increases due to the diffusion of lithium ions in the cathode materials before the inflection point appears, and the no-load voltage of the lithium secondary battery generally increases due to voltage relaxation of the cathode materials caused by the transfer of operating ions between the cathode materials after the inflection point appears.

Figure 3:
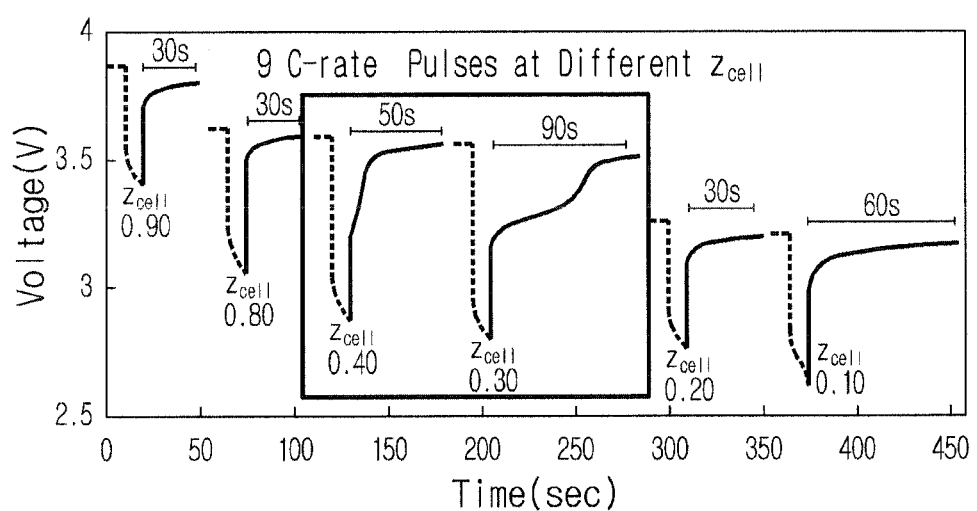
FIG. 3 is a graph showing that the voltage change pattern of the secondary battery exhibited due to the occurrence of voltage relaxation changes according to a SOC of the secondary battery.

FIG. 3 is a graph showing the change of no-load voltage of the lithium secondary battery under each SOC condition when discharging is stopped after performing 9 c-rate pulse discharge within a short time while changing a SOC $z_{cell}$ of the lithium secondary battery, which includes a blended cathode material in a cathode and carbon material in an anode where an NMC cathode material and an LFP cathode material are blended at a ratio of 7:3 (weight ratio), variously to 0.90, 0.80, 0.40, 0.30, 0.20 and 0.10.

In FIG. 3, $z_{cell}$ represents a SOC of the lithium secondary battery. In addition, at each voltage profile, a dotted line represents a dynamic voltage measured in a pulse discharge region, and a solid line represents a no-load voltage measured in the no-load state region.

Referring to FIG. 3, it may be understood that the inflection point supporting the occurrence of voltage relaxation starts appearing when a SOC of the lithium secondary battery decreases to about 0.40, and the voltage relaxation is maintained until the SOC becomes about 0.20. In other words, the voltage relaxation phenomenon appears when a SOC of the lithium secondary battery is within the range of 0.2 to 0.4 (marked with a rectangle).

The SOC of the lithium secondary battery is proportional to the dynamic voltage of the lithium secondary battery. In other words, if the dynamic voltage increases, the SOC increases, and if the dynamic voltage decreases, the SOC also decreases. Therefore, the intrinsic voltage range where the voltage relaxation phenomenon appears may be converted into a SOC range of the lithium secondary battery. For this reason, even though the intrinsic voltage range is converted into a SOC range of a secondary battery, the SOC range may be regarded as being substantially equivalent to the intrinsic voltage range, and therefore the SOC range of 0.2 to 0.4 should be understood as another kind of numerical expression of the intrinsic voltage range. Therefore, the SOC range of 0.2 to 0.4 may be regarded as an inherent SOC range corresponding to the intrinsic voltage range.

Meanwhile, it may be understood that, as the SOC of the lithium secondary battery is nearer to 0.20, the time taken until the occurrence of the inflection point or the time for the voltage of the lithium secondary battery to reach an equilibrium voltage increases. It is because this increase of time is caused by the following reasons. In other words, as the SOC of the lithium secondary battery becomes nearer to 0.20, the NMC cathode material mostly reacts with lithium ions and so the resistance of the NMC cathode material further increases. In addition, the amount of lithium ions intercalated into the LFP cathode material also further increases. Therefore, in order to transfer the lithium ions intercalated into the LFP cathode material toward the NMC cathode material by means of the voltage relaxation phenomenon, more time is required in proportion to the increase of resistance of the NMC cathode material and the increased amount of lithium ions intercalated into the LFP cathode material.

Figure 4:
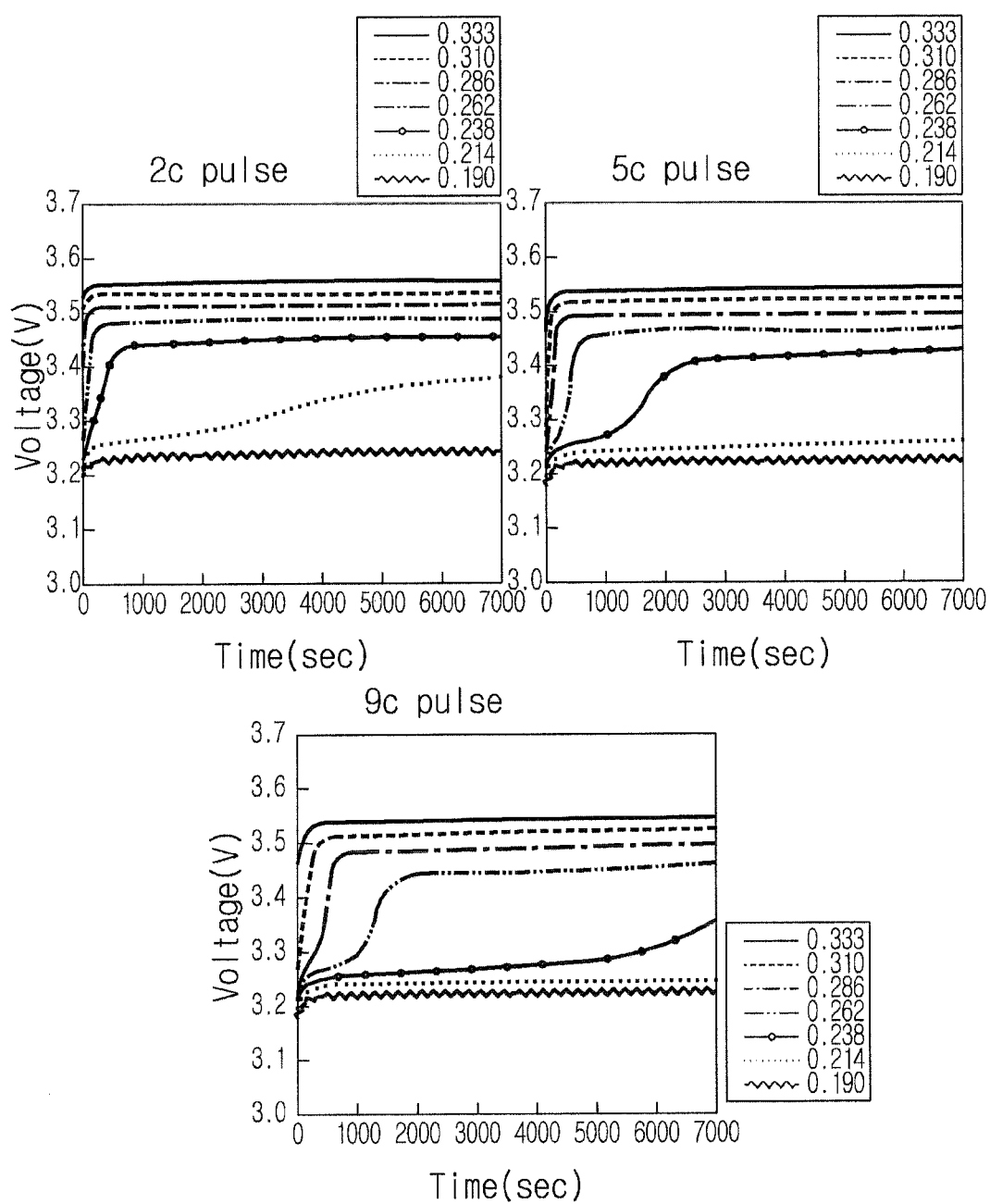
FIG. 4 is a graph showing that the voltage change pattern of the secondary battery exhibited due to the occurrence of voltage relaxation changes according to a discharge condition of the secondary battery.

FIG. 4 is a graph showing results of an experiment which evaluates an influence of the magnitude of a discharge current on the voltage relaxation phenomenon. The secondary battery used in this experiment is identical to that used in the former experiment.

The voltage profiles of FIG. 4 show the change of no-load voltage of the lithium secondary battery according to time, when the lithium secondary battery having the same blended cathode material as in the former embodiment stops pulse discharge while being pulse-discharged for 10 seconds at various SOCs (0.190~0.333) and various discharge currents (2 c, 5 c, 9 c) which allow the voltage relaxation phenomenon. Here, 'c' represents c-rate of the discharge current.

In FIG. 4, left, central and right graphs show voltage profiles when pulse discharge is stopped while being performed at 2 c, 5 c and 9 c, respectively.

Referring to FIG. 4, if the discharge current is identical, the lower the SOC of a secondary battery is, the later an inflection point supporting the occurrence of voltage relaxation appears. If the occurrence of the inflection point is delayed, the point of time when the no-load voltage of the lithium secondary battery reaches an equilibrium voltage is also delayed.

In addition, when the SOC of the secondary battery is identical, the higher the discharge current is, the later the inflection point appears in the voltage profile. If comparing three voltage profiles obtained when the SOC is 0.262, the voltage rapidly changes when the magnitude of the discharge current is 2 c, and so the inflection point appears just after the pulse discharge stops and the voltage reaches an equilibrium state within a short time. Meanwhile, it may also be understood that, when the magnitude of the discharge current is 5 c and 9 c, the voltage changes gradually and the inflection point appears late, and so the time taken until the occurrence of the inflection point is longer in the case where the magnitude of the discharge current is 9 c, in comparison to the case where the magnitude of the discharge current is 5 c. These facts reveal the following.

First, when the discharge current is identical, the lower the SOC of the secondary battery is, the greater the amount of lithium ions reacting with the LFP cathode material (a reaction concentration) is. The low SOC means that the resistance of the NMC cathode material increases that much more and so the possibility that lithium ions supplied by the discharge current reacts with the LFP cathode material increases. The increased amount of lithium ions reacting with the LFP cathode material also increases the time taken for transferring the lithium ions during the voltage relaxation. The increased time may be checked from the phenomenon that the occurrence of the inflection point and the time taken for the no-load voltage of the lithium secondary battery to reach an equilibrium voltage are delayed as the SOC of the secondary battery is lower in the voltage profiles of FIG. 4.

In addition, under the condition that the SOC of the secondary battery is identical, if the discharge current increases, the concentration of lithium ions reacting with the NMC cathode material increases, and the resistance of the NMC cathode material increases that much faster. Therefore, if the discharge current increases under the condition that the SOC of the secondary battery is identical, the time when lithium ions start reacting with the LFP cathode material is advanced and so an amount of lithium ions intercalated into the LFP cathode material further increases. Therefore, if the voltage relaxation phenomenon occurs, the time for the lithium ions intercalated in the LFP cathode material to be transferred to the NMC cathode material increases in proportion to the amount of lithium ions reacting with the LFP. The increased time may be checked from the fact that the occurrence of the inflection point and the time taken for the no-load voltage of the lithium secondary battery to reach an equilibrium voltage are delayed in the voltage profiles.

In addition, the SOC of a secondary battery where voltage relaxation starts is lowered as the discharge current is lower. In other words, if the discharge current is lowered in the intrinsic voltage range where voltage relaxation occurs, the increase of resistance of the NMC cathode material moderates, and so the possibility that lithium ions additionally react with the NMC cathode material increases. Therefore, lithium ions still react with the NMC cathode material even in a SOC condition that voltage relaxation starts when the discharge current is large. Therefore, under the condition that discharge current is low, the reaction between lithium ions and the LFP cathode material, required for generating a voltage relaxation, may be initiated only when the SOC is further lowered.

Next, conditions required for the blended cathode material having the first and second cathode materials to cause voltage relaxation in the intrinsic voltage range will be described in detail.

In an embodiment, the voltage relaxation may occur when, at the measurement of dQ/dV distribution of the first and second cathode materials, the cathode materials are different from each other in locations of their main peaks and/or intensities of the main peaks exhibited in the dQ/dV distribution.

Here, the dQ/dV distribution, as known in the art, represents a capacity characteristic of the cathode material at various operating voltages. The difference in locations and/ or intensities of the main peaks may be changed depending on the kinds of the first and second cathode materials.

Figure 5:
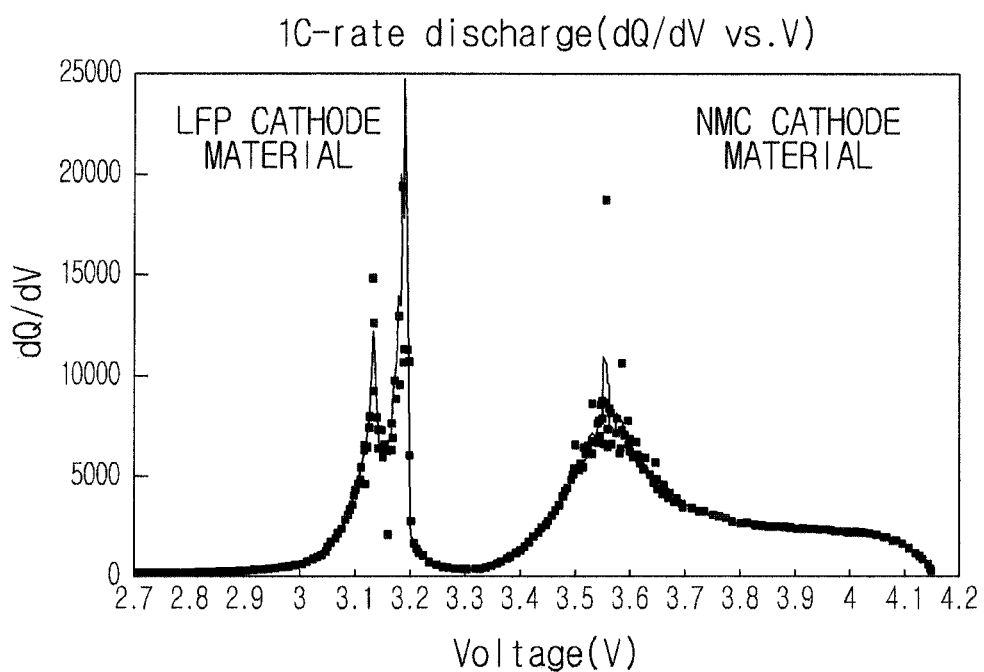
FIG. 5 is a graph showing dQ/dV distribution of a lithium secondary battery having an NMC cathode material and an LFP cathode material.

FIG. 5 is a graph showing measurement results of dQ/dV distribution, obtained by applying 1 c-rate discharge condition to a lithium secondary battery having a blended cathode material where an NMC cathode material and an LFP cathode material are blended at a ratio of 7:3 (weight ratio).

Referring to FIG. 5, two main peaks are present in the dQ/dV distribution, where the left peak corresponds to a main peak of the LFP cathode material and the right peak corresponds to a main peak of the NMC cathode material. In addition, profiles around the main peak of the LFP cathode material are generated as lithium ions react with the LFP cathode material, and profiles around the main peak of the NMC cathode material are generated as lithium ions react with the NMC cathode material.

As shown in FIG. 5, it may be understood that the difference of locations of the main peaks shown in the dQ/dV distribution of the NMC cathode material and the LFP cathode material is about 0.4V, and the intensity of the main peak of the LFP cathode material is about two times greater than that of the NMC cathode material. The NMC cathode material and the LFP cathode material having such dQ/dV characteristic exhibits a voltage relaxation phenomenon in the intrinsic voltage range, as described above with reference to FIG. 2. Therefore, if locations of the main peaks and/or intensities of the main peaks exhibited in the dQ/dV distribution of the first and second cathode materials are different, the blended cathode material where the first and second cathode materials are blended may be regarded as satisfying the condition of causing a voltage relaxation phenomenon in the intrinsic voltage range regardless of the kind of the first and second cathode materials.

In another embodiment, when measuring a discharge resistance of the lithium secondary battery containing the blended cathode material at various SOCs, the voltage relaxation may occur when the discharge resistance profile has a convex pattern or when the discharge resistance profile has two inflection points before and after the peak of the convex pattern.

Figure 6:
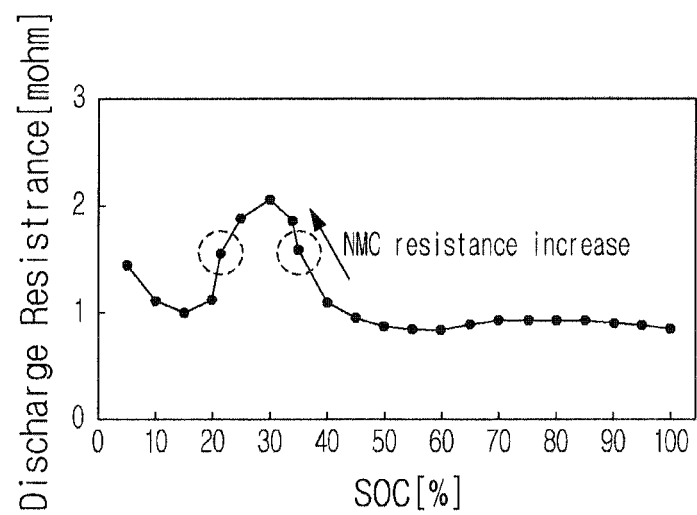
FIG. 6 is a graph showing a discharge resistance profile of a lithium secondary battery having an NMC cathode material and an LFP cathode material.

FIG. 6 is a discharge resistance profile showing measurement results of a discharge resistance according to the change of SOC with respect to a lithium secondary battery including the blended cathode material in a cathode and carbon material in an anode where an NMC cathode material and an LFP cathode material are blended at a ratio of 7:3 (weight ratio).

Referring to FIG. 6, it may be understood that the discharge resistance profile of the lithium secondary battery including the blended cathode material has a convex pattern when the SOC is about 20 to 40%. In addition, it may also be understood that two inflection points (marked by a dotted circle) occurs when the SOC is in the range of 20 to 30% and in the range of 30 to 40%, respectively, in the discharge resistance profile. In addition, it may be understood that the discharge resistance of the lithium secondary battery rapidly increases when the SOC belongs to the range of 30 to 40%, since the resistance of the NMC cathode material rapidly increases as most of the capacity of the NMC cathode material to which lithium ions may be intercalated is exhausted. The lithium secondary battery including the blended cathode material where the NMC cathode material and the LFP cathode material are blended exhibits a voltage relaxation phenomenon in the intrinsic voltage range as described above with reference to FIG. 2. Therefore, when the discharge resistance profile of the lithium secondary battery has a convex pattern or when the discharge resistance profile has two inflection points before and after the top of the convex pattern, the blended cathode material where the first and second cathode materials are blended may be regarded as satisfying the condition causing a voltage relaxation phenomenon in the intrinsic voltage range regardless of the kinds of the first and second cathode materials.

As another embodiment, the voltage relaxation may occur when the lithium secondary battery having the blended cathode material has an open-circuit voltage profile with at least one voltage plateau.

Figure 7:
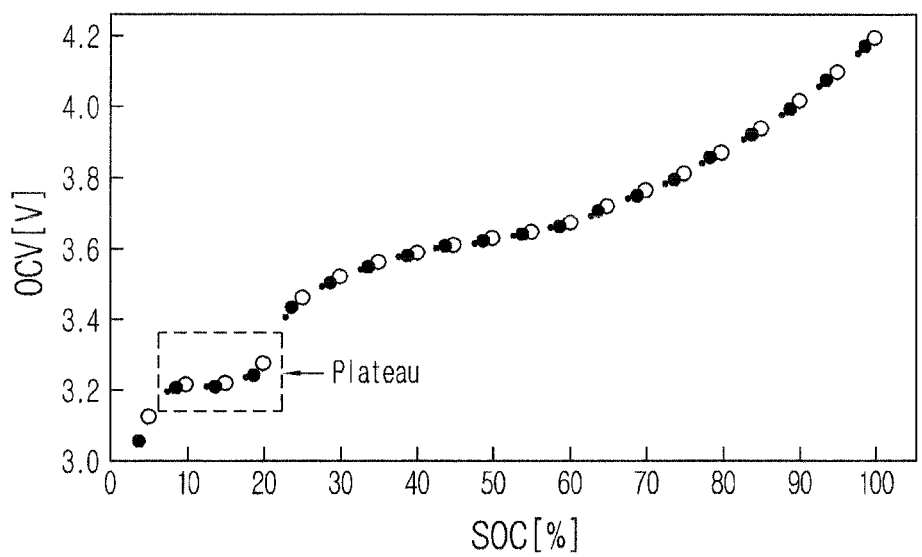
FIG. 7 is a graph showing a discharge profile of a lithium secondary battery having an NMC cathode material and an LFP cathode material.

FIG. 7 is an open-circuit voltage profile showing measurement results of an open-circuit voltage at various SOCs, obtained while discharging a lithium secondary battery including the blended cathode material in a cathode and carbon material in an anode where an NMC cathode material and an LFP cathode material are blended at a ratio of 7:3 (weight ratio).

Referring to FIG. 7, it may be understood that the open-circuit voltage profile of the lithium secondary battery including the blended cathode material has a voltage plateau substantially having no voltage change, when the open-circuit voltage is about 3.2V. Here, the voltage plateau is a region having an inflection point and a curvature conversion, and in the voltage plateau, even though an open-circuit voltage changes just a little, the SOC changes greatly. The lithium secondary battery including the blended cathode material where an NMC cathode material and an LFP cathode material are blended exhibits a voltage relaxation phenomenon in the intrinsic voltage range, as described above with reference to FIG. 2. From this, it may be confirmed that, when the open-circuit voltage profile of the lithium secondary battery has at least one voltage plateau, the blended cathode material where the first and second cathode materials are blended satisfies the condition of causing a voltage relaxation phenomenon in the intrinsic voltage range regardless of the kinds or blending ratio of the first and second cathode materials.

Figure 8:
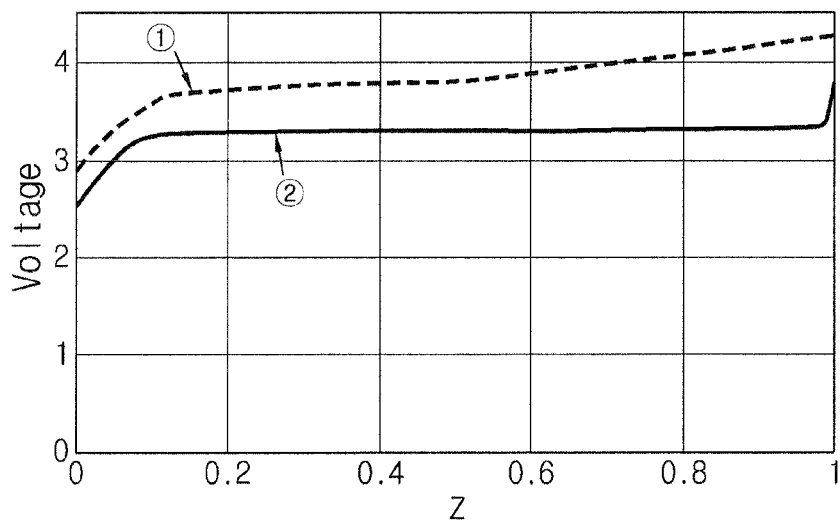
FIG. 8 is a graph showing measurement results of voltage profiles for a half cell manufactured so that an NMC cathode material and a lithium metal are respectively used as a cathode and an anode and a half cell manufactured so that an LFP cathode material and a lithium metal are respectively used as a cathode and an anode according to a variation of SOC.

FIG. 8 is a graph showing measurement results of voltage profiles at a SOC range of 0-1 with respect to a half cell manufactured so that an NMC cathode material and a lithium metal are respectively used as a cathode and an anode and a half cell manufactured so that an LFP cathode material and a lithium metal are respectively used as a cathode and an anode.

In FIG. 8, Graph ① depicts a voltage profile of the half cell including the NMC cathode material and Graph ② depicts a voltage profile of the half cell including the LFP cathode material.

Referring to FIG. 8, a voltage plateau is observed in the voltage profile of the half cell including the LFP cathode material.

This measurement results supports that in a secondary battery using a blended cathode material including an NMC cathode material and a LFP cathode material, at an early stage where the SOC starts decreasing from 100%, the NMC cathode material is activated so that lithium ions are mainly intercalated to the NMC cathode material; if the SOC decreases so that the voltage of the secondary battery is lowered to the level of the intrinsic voltage range, the LFP cathode material is activated so that lithium ions start being intercalated into the LFP cathode material; and if the SOC of the secondary battery comes to 0%, the SOCs of the NMC cathode material and the LFP cathode material also become 0%, which means that the capacity of each cathode material capable of accommodating a lithium ion is entirely used.

In an aspect, the graph of FIG. 8 supports that when at least one of the first and second cathode materials included in the blended cathode material has a voltage profile with a voltage plateau under the half cell condition, the secondary battery including the blended cathode material exhibits a voltage relaxation in the intrinsic voltage range.

In another aspect, the graph of FIG. 8 supports that when one of the first and second cathode materials included in the blended cathode material has a voltage profile with a voltage plateau under the half cell condition and the other has a voltage profile without a voltage plateau and with a higher voltage level in comparison to the voltage profile with a voltage plateau in at least a partial range among the entire SOC region under the half cell condition, the secondary battery including the blended cathode material exhibits a voltage relaxation in the intrinsic voltage range.

In the present disclosure, the first and second cathode materials may use any material without limitation if it may cause voltage relaxation in the intrinsic voltage range. Therefore, any combination of cathode materials satisfying at least one of the above conditions may be considered as the first and second cathode materials, in addition to the NMC cathode material and the LFP cathode material, as obvious to those skilled in the art.

In an embodiment, the first cathode material may be an alkali metal compound expressed by a general chemical formula $A[A_xM_y]O_{2+z}$ (A includes at least one of Li, Na and K; M includes at least one element selected from the group consisting of Ni, Co, Mn, Ca, Mg, Al, Ti, Si, Fe, Mo, V, Zr, Zn, Cu, Mo, Sc, Zr, Ru and Cr; $x \geq 0$, $1 \leq x+y \leq 2$, $-0.1 \leq z \leq 2$; and x, y, z and stoichiometric coefficients of the components included in M are selected so that the compound maintains electrically neutral).

Optionally, the first cathode material may be an alkali metal compound expressed by $xLiM^1O_2$-$(1-x)Li_2M^2O_3$ wherein $M^1$ includes at least one element with an average oxidation state of +3; $M^2$ includes at least one element with an average oxidation state of +4; and $0 \leq x \leq 1$, and selectively coated with a carbon layer, an oxide layer and a fluoride layer, which is disclosed in U.S. Pat. Nos. 6,677,082, 6,680,143 or the like.

In another embodiment, the second cathode material may be lithium metal phosphate expressed by a general chemical formula $Li_aM^1{}_xFe_{1-x}M^2{}_yP_{1-y}M^3{}_zO_{4-z}$ wherein $M^1$ is at least one element selected from the group consisting of Ti, Si, Mn, Co, V, Cr, Mo, Fe, Ni, Nd, Mg and Al; $M^2$ is at least one element selected from the group consisting of Ti, Si, Mn, Co, V, Cr, Mo, Fe, Ni, Nd, Mg, Al, As, Sb, Si, Ge, V and S; $M^3$ is at least one element of a halogen group selectively containing F; $0 < a \leq 2$, $0 \leq x \leq 1$, $0 \leq y < 1$, $0 \leq z < 1$; and a, x, y, z, and stoichiometric coefficients of components included in $M^1$, $M^2$, and $M^3$ are selected so that the lithium metal phosphate maintains electrical neutrality or $Li_3M_2(PO_4)_3$ wherein M is at least one element selected from the group consisting of Ti, Si, Mn, Fe, Co, V, Cr, Mo, Ni, Mg and Al.

In another embodiment, the first cathode material may be an alkali metal compound expressed by $Li[Li_aNi_bCo_cMn_d]O_{2+z}$ ($a \geq 0$; $a+b+c+d=1$; at least one of b, c and d is not zero; $-0.1 \leq z \leq 2$). In addition, the second cathode material may be at least one selected from the group consisting of $LiFePO_4$, $LiMn_xFe_yPO_4$ ($0 < x+y \leq 1$) and $Li_3Fe_2(PO_4)_3$.

In another embodiment, the first cathode material and/or the second cathode material may include a coating layer. The coating layer may include a carbon layer, or an oxide layer or a fluoride layer containing at least one selected from the group consisting of Ti, Si, Mn, Co, V, Cr, Mo, Fe, Ni, Nd, Mg, Al, As, Sb, Si, Ge, V and S.

In the present disclosure, the kind and blending ratio of the first and second cathode materials may be suitably selected or adjusted in consideration of the use of a secondary battery to be manufactured, an electrochemical design condition for the secondary battery, an electrochemical characteristic of cathode materials required for causing a voltage relaxation between the cathode materials, an intrinsic voltage range where voltage relaxation occurs, or the like.

In an embodiment, if a secondary battery with a good discharge power is desired, a cathode material having a good reactivity with lithium ions may be selected as one of the first and second cathode materials, and a mixture ratio of the corresponding cathode material may be set as high as possible. For example, $Li[Ni_{1/3}Mn_{1/3}Co_{1/3}]O_2$ and $LiFePO_4$ may be respectively selected as the first cathode material and the second cathode material, and a mixture ratio of the first cathode material and the second cathode material may be set to be 9:1.

In another embodiment, if a secondary battery with high-temperature stability is desired, a cathode material with excellent high-temperature stability may be selected as one of the first and second cathode materials, and a mixture ratio of the corresponding cathode material may be set as high as possible. For example, $Li[Ni_{1/3}Mn_{1/3}Co_{1/3}]O_2$ and $LiFePO_4$ may be respectively selected as the first cathode material and the second cathode material, and a mixture ratio of the first cathode material and the second cathode material may be set to be 2:8.

In another embodiment, if a secondary battery with a low production cost is desired, a cathode material with a low production cost may be selected as one of the first and second cathode materials, and a mixture ratio of the corresponding cathode material may be set as high as possible. For example, $Li[Ni_{1/3}Mn_{1/3}Co_{1/3}]O_2$ and $LiFePO_4$ may be respectively selected as the first cathode material and the second cathode material, and a mixture ratio of the first cathode material and the second cathode material may be set to be 1:9.

In another embodiment, if a secondary battery having a good discharge power and excellent high-temperature stability is desired, a cathode material having a good reactivity with operating ions and a cathode material having excellent high-temperature stability may be respectively selected as the first and second cathode materials, and a mixture ratio of the cathode materials may be set in consideration of balancing of the discharge power and the high-temperature stability. For example, $Li[Ni_{1/3}Mn_{1/3}Co_{1/3}]O_2$ and $LiFePO_4$ may be respectively selected as the first cathode material and the second cathode material, and a mixture ratio of the first cathode material and the second cathode material may be set to be 4:6.

In another embodiment, if a secondary battery having a great capacity per weight is desired, a cathode material having a great capacity per weight may be selected as one of the first and second cathode materials, and a mixture ratio of the corresponding cathode material may be set to be as high as possible. For example, $Li[Ni_{0.5}Mn_{0.3}Co_{0.2}]O_2$ and $LiFePO_4$ may be respectively selected as the first cathode material and the second cathode material, and a mixture ratio of the first cathode material and the second cathode material may be set to be 9:1.

The selection of the first and second cathode materials and the adjustment of their mixture ratio described above are just examples. Therefore, it is obvious to those skilled in the art that the first and second cathode materials may be suitably selected and a mixture ratio of the cathode materials may be suitably set in consideration of relative weights and balances of electrochemical properties to be endowed to the blended cathode material under the condition of causing voltage relaxation in an intrinsic voltage range.

Therefore, the number of kinds of cathode materials included in the blended cathode material is not limited to two. In addition, for enhancing properties of the blended cathode material, other additives such as a conducting agent, a binder or the like may be added to the blended cathode material without special limitation.

In an embodiment, the blended cathode material may include three kinds of cathode materials different from each other, for example a blended cathode material including $LiMn_2O_4$, $Li[Li_aNi_xCo_yMn_zO_2$ [$a \geq 0$; $a+x+y+z=1$; at least one of x, y and z is not zero] and $LiFePO_4$.

In another embodiment, the blended cathode material may have four kinds of cathode materials different from each other, for example a blended cathode material including $LiNiO_2$, $LiMn_2O_4$, $Li[Li_aNi_xCo_yMn_zO_2$ [$a \geq 0$; $a+x+y+z=1$; at least one of x, y and z is not zero] and $LiFePO_4$.

In the present disclosure, the blended cathode material including at least the first and second cathode materials may be used as a cathode material of a secondary battery which is charged or discharged in a voltage range including the intrinsic voltage range in order to utilize the voltage relaxation phenomenon.

The secondary battery may be loaded on various kinds of electric-driven apparatuses which operate with electric energy, and the kind of the electric-driven apparatus is not specially limited.

In an embodiment, the electric-driven apparatus may be a mobile computer device such as a cellular phone, a laptop, and a tablet computer; or a hand-held multimedia device such as a digital camera, a video camera, and an audio/video regenerating device.

In another embodiment, the electric-driven apparatus may be an electric-powered apparatus such as an electric vehicle, a hybrid vehicle, an electric bike, a motor cycle, an electric train, an electric ship, and an electric airplane; or a motor-mounted power tool such as an electric drill and an electric grinder.

In another embodiment, the electric-driven apparatus may be a large power storage device installed at a power grid to store new regeneration energy or surplus energy of a power plant, or an uninterrupted power supply for supplying power to various information communication devices such as server computers and mobile communication devices in times of emergency such as a blackout.

Meanwhile, as the environmental problems caused by the use of fossil fuel becomes more severe, electric vehicles or hybrid vehicles (hereinafter, generally referred to as electric vehicles) driven by a secondary battery are being actively studied.

Since the electric vehicle is expensive, a manufacturer wants a secondary battery which is cheap, ensures high capacity and power, has a long life cycle and has excellent safety. In order to make a secondary battery meeting the above conditions, the selection of a cathode material is very important. However, most commercialized cathode materials do not meet the conditions demanded in the market, and thus a blended cathode material obtained by blending two or more cathode materials may be a suitable alternative.

However, if a secondary battery having a blended cathode material is applied to an electric vehicle, the following unexpected problems may occur due to the voltage relaxation phenomenon.

In detail, a secondary battery having a blended cathode material causes a voltage relaxation phenomenon if the secondary battery comes to a no-load state while being discharged in an intrinsic voltage range.

A representative example of the no-load state may be a case in which the electric vehicle comes into a key-off state. Here, the key-off state means a state in which the electric vehicle is in an off state, for example when a start key is taken off from the key box.

However, if the electric vehicle comes into a key-off state while being discharged in an intrinsic voltage range, the no-load voltage of the secondary battery rises to an equilibrium state voltage while exhibiting a voltage change pattern according to the voltage relaxation phenomenon.

Meanwhile, the electric vehicle includes a function of estimating a SOC of a secondary battery by using a voltage of the secondary battery in a key-on state (hereinafter, referred to as a "key-on voltage"). The SOC of the secondary battery may be inherently determined according to an open circuit voltage. If the key-off state of the secondary battery is maintained during a sufficient time (until the voltage reaches the equilibrium state voltage), the key-on voltage may be regarded as being substantially identical to the open circuit voltage of the secondary battery. Therefore, if a SOC corresponding to the key-on voltage is mapped by using a look-up table in which corresponding relations between the open circuit voltage and the SOC are predefined, the SOC of the secondary battery may be easily estimated. However, if the electric vehicle comes into a key-on state before the voltage relaxation phenomenon entirely ends, the SOC of the secondary battery may not be accurately estimated using the above method.

Figure 9:
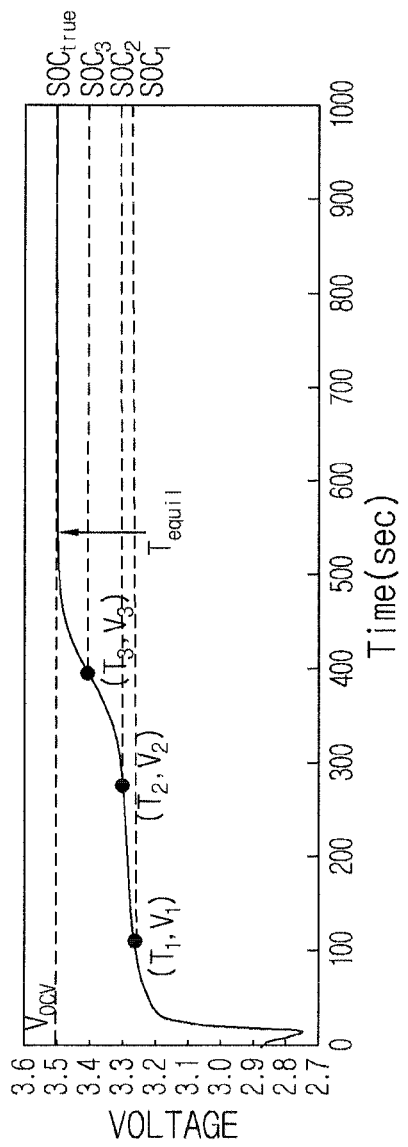
FIG. 9 is a diagram for illustrating the reason that an unexpected error occurs when the SOC of a secondary battery is estimated using a key-on voltage measured while a voltage relaxation phenomenon is happening.

FIG. 9 is a diagram for illustrating the reason that an unexpected error occurs when the SOC of a secondary battery is estimated using a key-on voltage measured while a voltage relaxation phenomenon is happening.

First, the voltage profile of FIG. 9 represents a voltage relaxation profile when a secondary battery having a blended cathode material in a discharge mode in an intrinsic voltage range comes into a no-load state by a key-off operation. Three points are shown on the voltage relaxation profile, and each point corresponds to different key-on time points. Regarding the coordinate recorded at each point, $T_1$, $T_2$ and $T_3$ respectively represent a time of each key-on point, and $V_1$, $V_2$ and $V_3$ respectively represents a key-on voltage measured at each key-on time point. The three key-on points are prior to the time ($T_{equil}$) taken for the voltage of the secondary battery to reach an equilibrium state voltage (3.5 V). Since the equilibrium state voltage substantially corresponds to the open circuit voltage ($V_{OCV}$) of the secondary battery, $V_1$, $V_2$ and $V_3$ have errors from $V_{OCV}$. In addition, since the error is proportional to the difference between the key-on point and the time point $T_{equil}$, assuming that an actual SOC corresponding to $V_{OCV}$ is $SOC_{true}$ and also SOCs estimated from $V_1$, $V_2$ and $V_3$ are respectively $SOC_1$, $SOC_2$ and $SOC_3$, $SOC_1$ has a greatest error and $SOC_3$ has a smallest error. Since the key-on voltage has an error from the open circuit voltage according to the key-on time point as described above, if a SOC of the secondary battery is estimated using the key-on voltage, the reliability deteriorates. Therefore, in order to solve this problem, there is needed a new approach to accurately estimate a SOC of a secondary battery in a key-on state.

First, as described above with reference to FIGS. 3 and 4, the voltage relaxation profile measured when a voltage relaxation phenomenon occurs at the secondary battery inherently changes according to a SOC of the secondary battery. Therefore, as long as a voltage relaxation profile on which the key-on voltage located can be specified, the SOC of the secondary battery may be reliably estimated.

Figure 10:
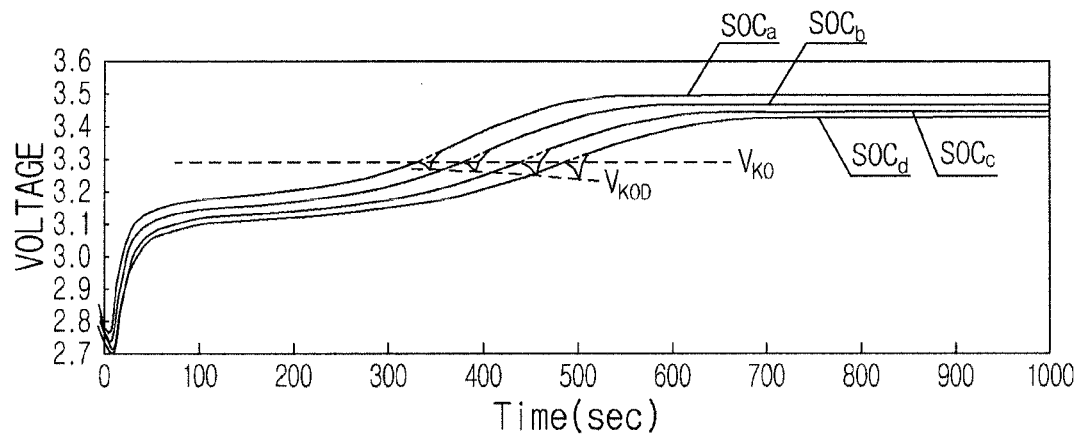
FIG. 10 is a graph showing voltage relaxation profiles obtained in four different SOCs where a voltage relaxation phenomenon occurs, with respect to a secondary battery having a blended cathode material in which an NMC cathode material and an LFP cathode material are blended in a ratio of 7:3 (weight ratio)

FIG. 10 is a graph showing voltage relaxation profiles obtained in four different SOCs where a voltage relaxation phenomenon occurs, with respect to a secondary battery having a blended cathode material in which an NMC cathode material and an LFP cathode material are blended in a ratio of 7:3 (weight ratio).

Referring to FIG. 10, the voltage relaxation time extends longer as the SOC is lower, and thus the SOC of the secondary battery is lower as the voltage relaxation profile is located further to the right on the graph (see FIGS. 3 and 4). Therefore, the SOC of the secondary battery is lowered in the order of $SOC_a$, $SOC_b$, $SOC_c$ and $SOC_d$.

In FIG. 10, $V_{KO}$ represents a key-on voltage, and the $V_{KO}$ voltage intersects four different voltage relaxation profiles. Therefore, the $V_{KO}$ voltage may be located on four different voltage relaxation profiles. In order to accurately estimate the SOC of the secondary battery, a voltage relaxation profile on which the $V_{KO}$ voltage is actually located should be exactly specified. For this, in the present disclosure, additional parameters may be further considered in addition to the key-on voltage. As the additional parameter, a voltage measured after a secondary battery is discharged just for a while after a device on which the secondary battery is loaded comes to a key-on state may be considered. Hereinafter, the voltage which may be considered as the additional parameter will be called a key-on discharge voltage ($V_{KOD}$). In addition, the discharge of the secondary battery for a while will be called a key-on discharge.

The key-on discharge voltage ($V_{KOD}$) is considered as the additional parameter due to the following reasons. First, if the device on which the secondary battery is loaded comes into a key-on state, the secondary battery performs key-on discharge while the secondary battery is being electrically connected to the load. Therefore, the information about the key-on discharge voltage may be easily obtained. The key-on discharge is not a discharge of the secondary battery to supply power to the load but a minute discharge automatically generated while the secondary battery is electrically connected to the load. Therefore, the energy emitted from the secondary battery through the key-on discharge is small, and the key-on discharge is maintained for a short time, for example for several seconds or several ten seconds. Second, even though the key-on voltage is identical, once the secondary battery is discharged, the voltage drops in different depths according to the SOC of the secondary battery and thus the key-on discharge voltage ($V_{KOD}$) varies. For reference, as the SOC of the secondary battery is lower, the voltage generated during a key-on discharging process drops more greatly, which may be checked from FIG. 10. In FIG. 10, a voltage change pattern having a valley shape occurs in the voltage relaxation profile, which originates from the key-on discharge. Therefore, if the key-on voltage and the key-on discharge voltage are put into consideration together, it is possible to accurately determine a voltage relaxation profile on which the key-on voltage is located, thereby allowing reliable estimation of the SOC.

For reference, if the electric vehicle comes into a key-on state, the secondary battery is electrically connected to a motor. At this time, the key-on discharge arises, and a discharge current flows for a short time from the secondary battery to the pre-charge relay. Here, the pre-charge relay is a switch component used for electrically connecting the motor to the secondary battery and plays a role of preventing a rush current from flowing from the secondary battery to the motor when the secondary battery is electrically connected to the motor. During the key-on discharging process, the current flowing to the pre-charge relay has intensity lower than 1 c-rate. The pre-charge relay is an electric component well known in the art and used for connecting the load to the secondary battery, as disclosed in U.S. Pat. No. 7,688,023 filed by the applicant of this application.

Figure 11:
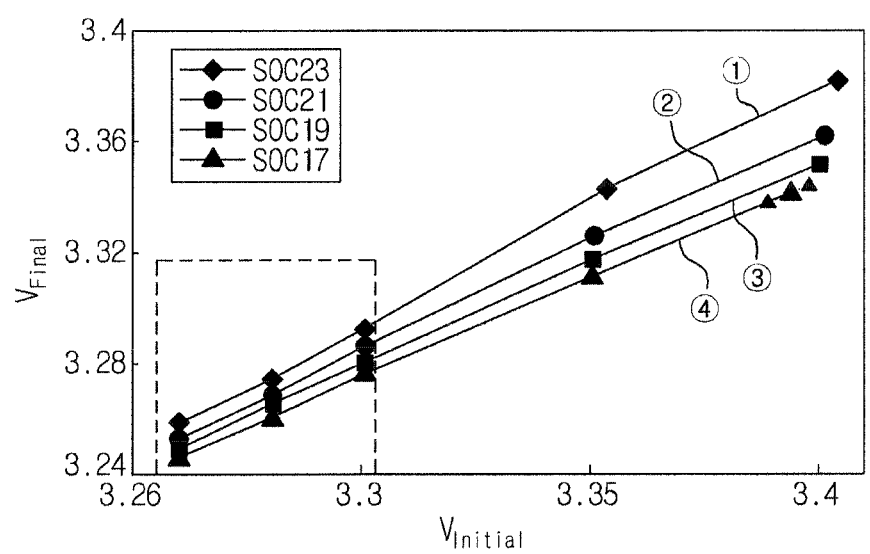
FIG. 11 is a graph showing an experiment result supporting that the key-on voltage and the key-on discharge voltage are useful parameters for measuring a SOC of a secondary battery having a blended cathode material.
Figure 12:
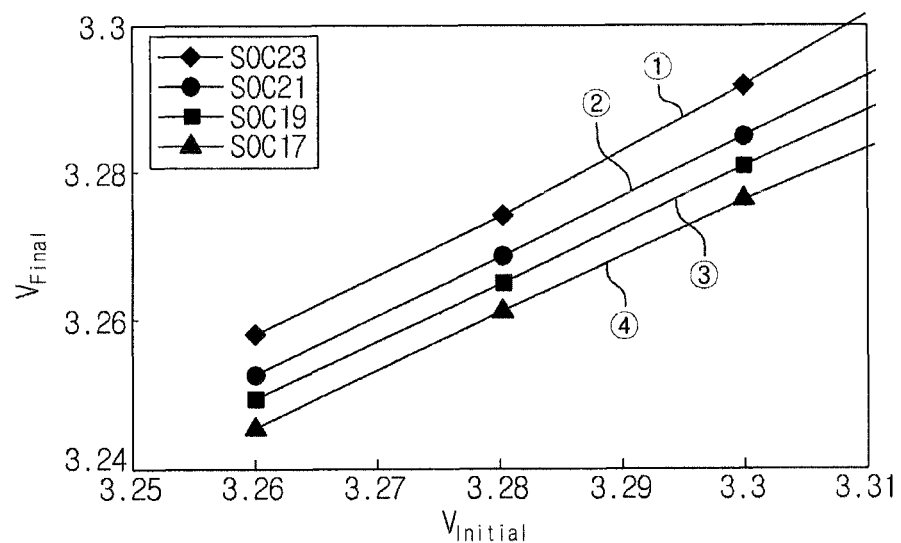
FIG. 12 is a graph showing an enlarged view of the rectangular dotted portion of FIG. 11.

FIG. 11 and FIG. 12 showing an enlarged view of the rectangular dotted portion of FIG. 11 show an experiment result supporting that the key-on voltage and the key-on discharge voltage are useful parameters for measuring a SOC of a secondary battery having a blended cathode material.

FIGS. 11 and 12 depict four profiles, and a process for obtaining a profile will be described below based on Graph ①. First, a secondary battery including a cathode having a blended cathode material in which an NMC cathode material and an LFP cathode material are blended at a ratio of 7:3 (weight ratio) and an anode having a carbon material was prepared, then the secondary battery was discharged until the SOC of the secondary battery decreases to the level of 23% at which a voltage relaxation phenomenon occurs, and then the secondary battery came to a no-load state. After that, the secondary battery was discharged to 0.1 c for a short time and the discharging process was stopped, which were repeated five times at time intervals. Here, the intensity of the discharge current and the time during which the discharge current flows were set identical to the intensity of a discharge current flowing from the secondary battery to the load by a key-on discharge generated when the device on which the secondary battery is loaded comes into a key-on state and the time during which the discharge current flows. In addition, at each discharge, a voltage ($V_{initial}$) before the discharge was initiated and a voltage ($V_{final}$) when the discharge was terminated was measured. After that, in order to obtain the profile as shown in Graph ①, $V_{initial}$ and $V_{final}$ were respectively depicted as a graph using an XY coordinate. In Graphs ②, ③ and ④, profiles were also obtained in the same way as above, but the SOC of the secondary battery was respectively controlled to 21%, 19%, and 17%, different from the case of obtaining Graph ①.

Referring to FIGS. 11 and 12, it may be found that if the SOC of the secondary battery is identical, $V_{initial}$ and $V_{final}$ measured at different discharge time points are located on a single profile. In addition, it may also be found that even though $V_{initial}$ is identical, $V_{final}$ is also lowered if the SOC of the secondary battery decreases. These two facts support that $V_{initial}$ and $V_{final}$ are parameters which can be used for reliably estimating the SOC of the secondary battery. Meanwhile, $V_{initial}$ and $V_{final}$ are obtained while the secondary battery is being discharged for a short time after the secondary battery comes to a no-load state. In addition, the discharge conditions (the intensity of current and the discharge time) applied when measuring $V_{initial}$ and $V_{final}$ are identical to the discharge conditions of the key-on discharge which is induced when the device on which the secondary battery is loaded comes into a key-on state. Therefore $V_{initial}$ and $V_{final}$ may be regarded as respectively corresponding to the key-on voltage ($V_{KO}$) and the key-on discharge voltage ($V_{KOD}$).

A plurality of profiles of $V_{initial}$ and $V_{final}$ obtained through the experiment may be converted into a look-up table or a look-up function for estimating an SOC of the secondary battery. In addition, in order to estimate the SOC more accurately, SOCs for obtaining the profiles may be preset more densely so that the number of profiles of $V_{initial}$ and $V_{final}$ to be converted into the look-up table or the look-up function increases further. For example, the profiles of $V_{initial}$ and $V_{final}$ may be obtained while changing the SOC at intervals of 1%.

The look-up table may include a plurality of data which configure profiles of $V_{initial}$ and $V_{final}$ for each SOC. In addition, the look-up function may be a function using $V_{initial}$ and $V_{final}$ as input parameters and also using the SOC as an output parameter. This function may be obtained by numerically analyzing a plurality of profiles obtained through experiments.

If the look-up table or the look-up function is used, when the device on which the secondary battery is loaded comes from a no-load state into a key-on state, a key-on voltage ($V_{KO}$) and a key-on discharge voltage ($V_{KOD}$) may be measured, and the SOC of the secondary battery may be reliably estimated from the measured voltages.

Here, the key-on discharge conditions when measuring the key-on voltage ($V_{KO}$) and the key-on discharge voltage ($V_{KOD}$) may be identical to the discharge conditions when $V_{initial}$ and $V_{final}$ are measured.

For example, when the look-up table is used, $V_{initial}$ and $V_{final}$ data matched with the key-on voltage ($V_{KO}$) and the key-on discharge voltage ($V_{KOD}$) are identified in the look-up table, and an SOC corresponding to the identified $V_{initial}$ and $V_{final}$ may be estimated as the SOC of the secondary battery.

As another example, when the look-up function is used, the key-on voltage ($V_{KO}$) and the key-on discharge voltage ($V_{KOD}$) are put as input values of the look-up function to obtain SOC as an output value, thereby estimating the SOC of the secondary battery.

Now, examples of the apparatus and method for estimating a SOC of a secondary battery having a blended cathode material according to the present disclosure will be explained in detail based on the above description.

Figure 13:
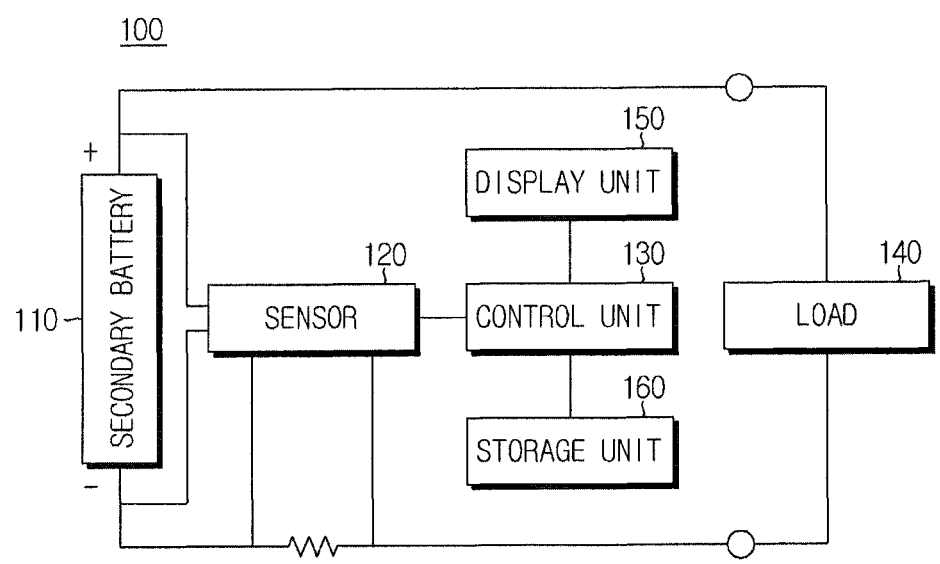
FIG. 13 is a block diagram schematically showing a SOC estimating apparatus of a secondary battery having a blended cathode material according to an embodiment of the present disclosure.

FIG. 13 is a block diagram schematically showing a SOC estimating apparatus 100 of a secondary battery including a blended cathode material according to an embodiment of the present disclosure.

As shown in FIG. 13, the SOC estimating apparatus 100 includes a sensor 120 and a control unit 130 and is electrically connected to the secondary battery 110 including a blended cathode material to estimate a SOC of the secondary battery 110.

The SOC estimating apparatus 100 is electrically connected to a load 140. The load 140 may be included in various kinds of electric-driven apparatuses and means an energy-consuming device included in an electric-driven apparatus operated with the electric energy supplied when the secondary battery 110 is discharged. The load may be a rotation-driving device such as a motor, a power-converting device such as an inverter, or the like, but the present disclosure is not limited to specific kinds of loads.

The SOC estimating apparatus 100 may further include a storage unit 160, selectively. The storage unit 160 stores data in relation to a predetermined relationship between the key-on voltage ($V_{KO}$) and the key-on discharge voltage ($V_{KOD}$) of the secondary battery 110 and the SOC.

Data in relation to the relationship may be obtained in advance through experiments. The data in relation to the relationship may be a look-up table or a look-up function, without being limited thereto. The look-up table and the look-up function are described above and will not be described in detail here. The look-up table and the look-up function may be stored in the storage unit 160 as binary data or a part of program codes.

The storage unit 160 is not specially limited if it may serve as a storage medium capable of recording and erasing information. For example, the storage unit 160 may be RAM, ROM, register, hard disk, optical recording medium or magnetic recording medium. The storage unit 160 may be connected to the control unit 130 so as to be accessed by the control unit 130 through, for example, a data bus or the like. The storage unit 160 store and/or update and/or erase and/or transmit program having various control logics executed by the control unit 130 and/or data generated when the control logics are executed. The storage unit 160 may be divided into two or more logic units and may also be included in the control unit 130, without any restriction.

The SOC estimating apparatus 100 may further include a display unit 150, selectively. The display unit 150 is not specially limited as long as it may display a SOC of the secondary battery 110 calculated by the control unit 130 as a graphic interface. Here, the graphic interface means an interface displaying a SOC directly with digits or as a relative level by using graphic elements such as a bar graph. For example, the display unit 150 may be a liquid crystal display, an LED display, an OLED display, an E-INK display, a flexible display or the like.

The display unit 150 may be connected to the control unit 130 directly or indirectly. When indirect connection is adopted, the display unit 150 may be located in an area physically separated from the area where the control unit 130 is located. In addition, a third control unit (not shown) may be interposed between the display unit 150 and the control unit 130 to receive information, which will be displayed on the display unit 150 by the third control unit, from the control unit 130 and display the information on display unit 150. For this, the third control unit and the control unit 130 may be connected through a communication line.

The sensor 120 measures a key-on voltage ($V_{KO}$) and a key-on discharge voltage ($V_{KOD}$) when the device on which the secondary battery 110 is loaded comes from a no-load state into a key-on state. In other words, if the device on which the secondary battery 110 is loaded comes into a key-on state, a key-on discharge is induced and a weak discharge current flows from the secondary battery 110 to the load for a short time so that the voltage of the secondary battery 110 changes. At this time, the sensor 120 may measure a voltage just after the secondary battery 110 comes into a key-on state and a voltage whose intensity has been changed due to the key-on discharge as the key-on voltage ($V_{KO}$) and the key-on discharge voltage ($V_{KOD}$), respectively. In addition, the sensor 120 may provide the measured key-on voltage ($V_{KO}$) and the key-on discharge voltage ($V_{KOD}$) to the control unit 130.

The sensor 120 may measure a discharge current output from the secondary battery 110 during the key-on discharging process and provide the measured discharge current to the control unit 130.

The control unit 130 executes at least one control logic required for estimating the SOC of the secondary battery 110 by using the measured key-on voltage ($V_{KO}$) and the key-on discharge voltage ($V_{KOD}$).

The control logic may include at least a logic for storing the key-on voltage ($V_{KO}$) and the key-on discharge voltage ($V_{KOD}$) measured by the sensor 120 to the storage unit 160.

The control logic may also include a logic for estimating the SOC of the secondary battery from the measured key-on voltage ($V_{KO}$) and the key-on discharge voltage ($V_{KOD}$) with reference to the look-up table or the look-up function stored in the storage unit 160.

For example, the control logic may include a logic for estimating the SOC of the secondary battery by identifying $V_{initial}$ and $V_{final}$ data matched with the measured key-on voltage ($V_{KO}$) and the key-on discharge voltage ($V_{KOD}$) in the look-up table and identifying the SOC corresponding to the identified $V_{initial}$ and $V_{final}$.

As another example, the control logic may estimate the SOC of the secondary battery by putting the measured key-on voltage ($V_{KO}$) and the key-on discharge voltage ($V_{KOD}$) as input values of the look-up function to obtain a SOC as an output value.

The control logic may determine whether the key-on voltage ($V_{KO}$) belongs to an intrinsic voltage range of the secondary battery in which a voltage relaxation phenomenon occurs, and estimate the SOC of the secondary battery by using the above logics when the key-on voltage ($V_{KO}$) belongs to the inherent voltage range.

The control logic may further include a logic for storing the estimated SOC in the storage unit 160 and/or a logic for outputting the estimated SOC through the display unit 150 and/or a logic for outputting the estimated SOC to another external control device. Another external control device may be a central computing device for electronically controlling components loaded on a vehicle, for example an engine, when the secondary battery 110 is used for an electrically-driven vehicle.

The control unit 130 may selectively include processors well known in the art, ASIC (application-specific integrated circuit), other chipsets, logic circuits, registers, communication modems, data processing devices or the like in order to execute various control logics described below. In addition, when the control logic is implemented as software, the control unit 130 may be implemented as an aggregate of program modules. At this time, program modules may be stored in a memory and executed by processors. The memory may be present in or out of the processor and may be connected to the processor by various means. In addition, the memory may be included in the storage unit 160 of the present disclosure. Moreover, the memory is a general name to represent devices storing information, regardless of the kind of devices, without being limited to a specific memory device.

In addition, at least one of various control logics of the control unit 130 may be combined, and the combined control logics may be composed in computer-readable program codes and recorded in a computer-readable recording medium. The recording medium is not specially limited if it may be accessed by a processor included in a computer. For example, the recording medium includes at least one selected from the group consisting of ROM, RAM, register, CD-ROM, magnetic tape, hard disk, floppy disk and optical data storage. In addition the code system may be modulated into carrier signals and included in a communication carrier at a specific time and also be distributed to, stored in and executed by computers connected by a network. In addition, functional programs, codes and code segments for implementing the combined control logics may be easily inferred by programmers in the art.

Hereinafter, a method for estimating SOC of a secondary battery containing a blended cathode material by using the above apparatus will be described in detail.

Figure 14:
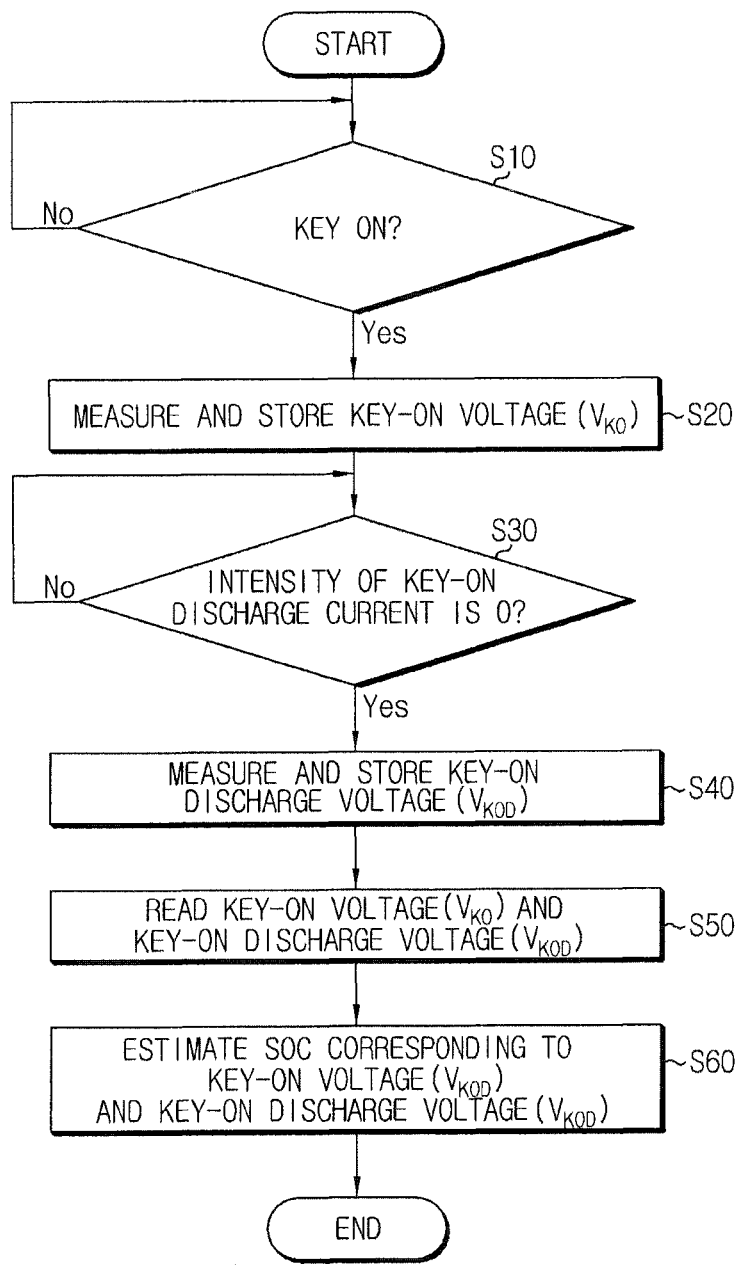
FIG. 14 is a flowchart for illustrating a method for estimating a SOC of a secondary battery having a blended cathode material according to an embodiment of the present disclosure.

FIG. 14 is a flowchart for illustrating a method for estimating a SOC of a secondary battery having a blended cathode material according to an embodiment of the present disclosure.

Referring to FIG. 14 together with FIG. 13, the control unit 130 determines at regular time intervals whether a device on which the secondary battery 110 is loaded comes into a key-on state (S10). For this determination, the control unit 130 may receive an electric signal representing a key-on state from a central computing device of the device on which the secondary battery 110 is loaded, and execute a logic of Step S10 according to whether the electric signal is received or not.

If it is determined that the device on which the secondary battery 110 is loaded comes into a key-on state, the control unit 130 measures a key-on voltage ($V_{KO}$) of the secondary battery 110 by using the sensor 120 and stores the key-on voltage in the storage unit 160 (S20). Here, the key-on voltage ($V_{KO}$) is measured at least before a discharge current starts flowing by the key-on discharge. In addition, after the key-on voltage ($V_{KO}$) is measured, a current of a small intensity flows from the secondary battery 110 to the load 140 within a short time by the key-on discharge.

Next, the control unit 130 monitors an intensity of the discharge current flowing from the secondary battery 110 to the load 140 by using the sensor 120 just after the key-on voltage ($V_{KO}$) is measured, and determines whether the intensity of the discharge current becomes substantially 0 (S30).

If it is determined that the intensity of the discharge current becomes substantially 0, the control unit 130 measures a key-on discharge voltage ($V_{KOD}$) of the secondary battery 110 by using the sensor 120 and stores the key-on discharge voltage in the storage unit 160 (S40).

If the key-on discharge voltage ($V_{KOD}$) is completely measured, the control unit 130 reads the key-on voltage ($V_{KO}$) and the key-on discharge voltage ($V_{KOD}$) stored in the storage unit 160 (S50).

Subsequently, the control unit 130 estimates a SOC of the secondary battery corresponding to the measured key-on voltage ($V_{KO}$) and the key-on discharge voltage ($V_{KOD}$) by using the data in relation to a predetermined relationship between the key-on voltage ($V_{KO}$) and the key-on discharge voltage ($V_{KOD}$), stored in the storage unit 160, and the SOC (S60). Here, the data in relation to the relationship may be a look-up table or a look-up function.

For example, the control unit 130 may estimate a SOC of the secondary battery by identifying $V_{initial}$ and $V_{final}$ data matching with the measured key-on voltage ($V_{KO}$) and the key-on discharge voltage ($V_{KOD}$) from the look-up table and identifying a SOC corresponding to the identified $V_{initial}$ and $V_{final}$.

In another example, the control logic may estimate a SOC of the secondary battery by inputting the measured key-on voltage ($V_{KO}$) and the measured key-on discharge voltage ($V_{KOD}$) as input values of the look-up function and obtaining a SOC as an output value.

Though not shown in the figures, the control unit 130 may further execute a logic for storing the estimated SOC in the storage unit 160 and/or a logic for outputting the estimated SOC through the display unit 150 as a graphic interface and/or a logic for outputting the estimated SOC to another external controller.

The control unit 130 may update the latest estimated SOC of the secondary battery into a newly estimated SOC. The latest estimated SOC of the secondary battery is stored in the storage unit 160.

If the SOC is updated as described above, errors accumulated while repeatedly calculating SOCs before the SOC is updated may be entirely removed.

Meanwhile, the control unit 130 may determine whether the measured key-on voltage ($V_{KO}$) falls within the intrinsic voltage range in which the secondary battery causes a voltage relaxation phenomenon, before executing Step S60. In addition, the control unit 130 may execute Step S60 when the measured key-on voltage ($V_{KO}$) falls within the intrinsic voltage range in which the secondary battery causes a voltage relaxation phenomenon.

In the above embodiment, the key-on discharge caused when the device on which the secondary battery 110 is loaded comes into a key-on state has been described as naturally occurring when the secondary battery 110 and the load 140 are electrically connected. However, the key-on discharge is not limited to such a naturally caused discharge. Therefore, the key-on discharge may also be caused intentionally. For this, the SOC estimating apparatus 100 may further include a discharge unit (for example: a resistor). In addition, in order to measure the key-on discharge voltage ($V_{KOD}$), the control unit 130 may connect the discharge unit to the secondary battery 110 through switches within a short time so that the secondary battery 110 is discharged with substantially the same discharge condition as the key-on discharge. The point when the discharge unit and the secondary battery 110 are connected may be suitably selected after the device on which the secondary battery 110 is loaded comes into a key-on state.

Meanwhile, the key-on discharge voltage ($V_{KOD}$) and the $V_{final}$ are not limited to voltages of the secondary battery 110 measured when the key-on discharge is substantially completed. The key-on discharge voltage is not specially limited if it is a voltage measured at a predetermined point in the voltage change pattern shown after the voltage of the secondary battery drops during the key-on discharge until the voltage of the secondary battery returns to the voltage relaxation profile. Therefore, the condition for measuring the key-on discharge voltage ($V_{KOD}$) and the $V_{final}$ may be modified in various ways.

For example, a voltage measured a predetermined time (e.g., 10 seconds) after the key-on discharge is initiated may be used as the key-on discharge voltage ($V_{KOD}$) and the $V_{final}$. In another example, a voltage a predetermined time (e.g., 5 seconds) after the key-on discharge is completed may be used as the key-on discharge voltage ($V_{KOD}$) and the $V_{final}$. In another example, a voltage measured when the voltage variation of the secondary battery 110 caused by the key-on discharge ends (namely, when the voltage of the secondary battery returns to the voltage relaxation profile) may be used as the key-on discharge voltage ($V_{KOD}$) and the $V_{final}$. In another example, a voltage measured when a minimum point is formed in a voltage change pattern of the secondary battery formed by the key-on discharge may be used as the key-on discharge voltage ($V_{KOD}$) and the $V_{final}$. In another example, a voltage measured when a voltage variation per unit time is greatest in the voltage change pattern of the secondary battery 110 formed by the key-on discharge may be used as the key-on discharge voltage ($V_{KOD}$) and the $V_{final}$.

The present disclosure may also be applied to estimate a SOC of a secondary battery containing a single cathode material in a cathode. In other words, if a secondary battery containing a single cathode material comes into a no-load state while being discharged, similar to FIG. 10, the voltage of the secondary battery slowly rises to an equilibrium voltage. In addition, the pattern in which the voltage of the secondary battery rises to the equilibrium voltage may be changed according to a state of the secondary battery. Therefore, regarding the secondary battery containing a single cathode material, if the discharge inception voltage ($V_{initial}$) and the final discharge voltage ($V_{final}$) are measured while the secondary battery is discharged in a no-load state for a short time (for example, key-on discharge), a SOC corresponding to the measured discharge inception voltage ($V_{initial}$) and the final discharge voltage ($V_{final}$) may be estimated from a predetermined relationship between the discharge inception voltage ($V_{final}$) and the final discharge voltage ($V_{final}$) and the SOC. Here, the predetermined relationship may be a look-up table or a look-up function as described above.

In the present disclosure, the secondary battery may include a cathode containing a blended cathode material, an anode containing an anode material anode and a separator.

In an embodiment, the cathode may include a thin-plate metallic current collector made of conductive material, and a cathode material coating layer containing the blended cathode material and formed on at least one surface of the metallic current collector.

The metallic current collector is made of material with chemical stability and high conductivity. For example, the metallic current collector may be made of aluminum, stainless steel, nickel, titanium, sintered carbon or the like. As another example, the metallic current collector may be made of aluminum or stainless steel coated with carbon, nickel, titanium, silver or the like on the surface thereof.

The cathode material coating layer may further include additives such as a conducting agent and a binder in addition to the blended cathode material.

The conducting agent is not specially limited if it may improve electric conductivity of the blended cathode material, and may use various conductive carbonaceous materials such as graphite, carbon black, acetylene black, Ketjen black, Super-P, carbon nano tube or the like, without being limited thereto.

The binder is not specially limited if it allows a close physical joint among particles of the blended cathode material and a close interfacial joint between the blended cathode material and the metallic current collector. Various kinds of polymers such as poly(vinylidene fluoride-co-hexafluoro-propylene polymer) (PVDF-co-HFP), polyvinylidene fluoride, polyacrylonitrile, polymethyl methacrylate or the like may be used as the binder, without being limited thereto.

In an embodiment, the anode may include a thin-plate metallic current collector made of conductive material, and an anode material coating layer containing anode material and formed on at least one surface of the metallic current collector.

The metallic current collector is made of material with chemical stability and high conductivity. For example, the metallic current collector may be made of copper, aluminum, stainless steel, nickel, titanium, sintered carbon or the like. As another example, the metallic current collector may be made of copper or stainless steel coated with carbon, nickel, titanium, silver or the like on the surface thereof or an aluminum-cadmium alloy.

The anode material is not specially limited if it has a different oxidation/reduction potential (redox potential) from the blended cathode material and allows intercalation of operating ions during the charging process and deintercalation of operating ions during the discharging process.

The anode material may use carbonaceous material, lithium metal, silicon, tin or the like, without being limited thereto, and may also use metal oxides such as $TiO_2$ and $SnO_2$ with a potential lower than 2V. Preferably, the anode material may use carbonaceous material, and the carbonaceous material may use both low crystalline carbon and high crystalline carbon. The low crystalline carbon representatively includes soft carbon and hard carbon, and the high crystalline carbon representatively includes high-temperature sintered carbon such as natural graphite, Kish graphite, pyrolytic carbon, mesophase pitch based carbon fiber, mesocarbon microbeads, mesophase pitches, petroleum derived cokes, and tar pitch derived cokes.

The anode material coating layer may further include additives such as a conducting agent and a binder in addition to the anode material. The conducting agent and the binder may use materials which are available as a conducting agent and a binder included in a cathode material coating layer.

The separator is not specially limited if it has a pore structure for electrically separating the cathode and the anode and allowing the transfer of operating ions.

In an embodiment, the separator may use a porous polymer film, for example a porous polymer film made from polyolefin-based polymer such as ethylene homopolymer, propylene homopolymer, ethylene/butene copolymer, ethylene/hexene copolymer, and ethylene/methacrylate copolymer, or their laminates. As other examples, a common porous non-woven fabric made from, for example, high-melting glass fibers or polyethylene terephthalate fibers may be used.

Meanwhile, at least one surface of the separator may include a coating layer of inorganic particles. In addition, the separator may be made of a coating layer of inorganic particles. The particles of the coating layer may have a structure coupled with a binder so that interstitial volumes are present among adjacent particles. This structure is disclosed in PCT International Publication WO 2006/025662, which may be incorporated herein by reference. The inorganic particles may be made of inorganic material with a dielectric constant of 5 or above. The inorganic materials may include at least one selected from the group consisting of $Pb(Zr,Ti)O_3$ (PZT), $Pb_{1-x}La_xZr_{1-y}Ti_yO_3$ (PLZT), $PB(Mg_3Nb_{2/3})O_3$—$PbTiO_3$ (PMN-PT), $BaTiO_3$, hafnia ($HfO_2$), $SrTiO_3$, $TiO_2$, $Al_2O_3$, $ZrO_2$, $SnO_2$, $CeO_2$, MgO, CaO, ZnO and $Y_2O_3$, without being limited thereto.

The secondary battery may also further include an electrolyte containing operating ions. The electrolyte is not specially limited if it may include operating ions and cause an electrochemical oxidation or reduction reaction at the cathode and the anode by means of the operating ions.

The electrolyte may be a salt having a structure of $A^+B^-$, without being limited thereto. Here, the $A^+$ includes alkali metallic cations such as $Li^+$, $Na^+$, and $K^+$ or their combinations. In addition, $B^-$ includes at least one anion selected from the group consisting of $F^-$, $Cl^-$, $Br^-$, $I^-$, $NO_3^-$, $N(CN)_2^-$, $BF_4^-$, $ClO_4^-$, $AlO_4^-$, $AlCl_4^-$, $PF_6^-$, $SbF_6^-$, $AsF_6^-$, $BF_2C_2O_4^-$, $BC_4O_8^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $C_4F_9SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$, and $(CF_3CF_2SO_2)_2N^-$.

The electrolyte may also be used in a state of being dissolved in an organic solvent. The organic solvent may use propylene carbonate (PC), ethylene carbonate (EC), diethyl carbonate (DEC), dimethyl carbonate (DMC), dipropyl carbonate (DPC), dimethyl sulfoxide, acetonitrile, dimethoxyethane, diethoxyethane, tetrahydrofuran, N-methyl-2-pyrrolidone (NMP), ethyl methyl carbonate (EMC), γ-butyrolactone, or their mixtures.

In an embodiment, the secondary battery may further include a package for sealing the cathode, the anode and the separator. In the case the cathode, the anode and the separator are sealed by the package, the cathode and the anode may be respectively jointed to a cathode terminal and an anode terminal, and the cathode terminal and the anode terminal may be led out of the package. On occasions, in the case the package serves as an electrode terminal, either the cathode terminal or the anode terminal may be replaced with the package. For example, if the anode is electrically connected to the inside of the package, the outer surface of the package may function as an anode. The package is not specially limited if it has chemical stability and may be made of metal, polymer, a flexible pouch film or the like, without being limited thereto. The flexible pouch film may be representatively an aluminum pouch film where a thermal bonding layer, an aluminum layer and an outer protection layer are laminated.

The appearance of the secondary battery is determined by the structure of the package. The package may adopt any structure used in the art and its appearance according to the use of a battery is not specially limited. The package may have structures such as a cylindrical shape, a rectangular shape, a pouch shape, a coin shape, or curved shapes thereof without being limited thereto.

The secondary battery includes an electrode assembly in which unit cells, each having at least a laminated structure of cathode/separator/anode, are assembled. The unit cell may have various structures known in the art. For example, the unit cell may have a bi-cell structure where outermost electrodes have the same polarity or a full-cell structure where outermost electrodes have opposite polarities. The bi-cell may have a structure of cathode/separator/anode/separator/cathode, for example. The full-cell may have a structure of, for example, cathode/separator/anode/separator/cathode/separator/anode.

The electrode assembly may have various structures known in the art, and for example the electrode assembly may have a simple stack structure where the unit cell and an insulating film are repeatedly laminated from the bottom to the top. In addition, the electrode assembly may have a stack folding structure formed by disposing unit cells on an insulative folding film at regular intervals and then rolling the insulative folding film together with the unit cells in a predetermined direction. In addition, the electrode assembly may have a jelly roll structure formed by placing a unit cell prepared in a sheet shape extending in one direction on an insulative rolling film and then rolling the unit cell and the insulative rolling film together.

In various embodiments of the present disclosure, components named 'unit' should be understood as functionally distinguishable elements and not physically distinguishable elements. Therefore, each component may be integrated with another component, selectively, or each component may be divided into sub complements for efficient execution of control logic(s). However, even though components are integrated or divided, such integrated or divided components should be interpreted as being within the scope of the present disclosure if their functions are recognized as having substantially the same identity as the present disclosure, as obvious to those skilled in the art.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:
1. An apparatus for estimating a state of charge (SOC) of a secondary battery, which includes a cathode having a blended cathode material containing a first cathode material and a second cathode material with different operating voltage ranges, an anode having an anode material, and a separator for separating the cathode from the anode, the apparatus comprising:
  a sensor configured to measure a discharge inception voltage and a final discharge voltage when the secondary battery is discharged for a predetermined time; and
  a control unit configured to estimate a SOC of the secondary battery corresponding to the measured discharge inception voltage and the measured final discharge voltage by using a predetermined relationship between the discharge inception voltage and the final discharge voltage and the SOC of the secondary battery,
  wherein the discharge inception voltage is a key-on voltage measured right after the secondary battery in a no-load state comes to a key-on state, and
  wherein the final discharge voltage is a key-on discharge voltage measured after the secondary battery in the key-on state performs key-on discharge for a predetermined time.

2. The apparatus for estimating a SOC of a secondary battery according to claim 1,
  wherein the predetermined relationship is a look-up table which defines a relationship between the key-on voltage and the key-on discharge voltage and the SOC of the secondary battery.

3. The apparatus for estimating a SOC of a secondary battery according to claim 2, further comprising a storage unit in which the look-up table is stored.

4. The apparatus for estimating a SOC of a secondary battery according to claim 1,
  wherein the predetermined relationship is a look-up function using the key-on voltage and the key-on discharge voltage as input parameters and the SOC as an output parameter.

5. The apparatus for estimating a SOC of a secondary battery according to claim 4, further comprising a storage unit in which the look-up function is stored.

6. The apparatus for estimating a SOC of a secondary battery according to claim 1,
  wherein the relationship is predetermined by applying the same discharge condition as the key-on discharge.

7. The apparatus for estimating a SOC of a secondary battery according to claim 1,
  wherein the key-on discharge is a constant current discharge.

8. The apparatus for estimating a SOC of a secondary battery according to claim 1, further comprising a discharge unit selectively connected to the secondary battery,
  wherein the control unit connects the discharge unit to the secondary battery in order to discharge the secondary battery for a predetermined time.

9. The apparatus for estimating a SOC of a secondary battery according to claim 1,
  wherein the key-on discharge is automatically performed when the secondary battery comes to a key-on state.

10. The apparatus for estimating a SOC of a secondary battery according to claim 1,
  wherein when the secondary battery is in a no-load state, the SOC falls within a SOC range which causes a voltage relaxation phenomenon by transferring operating ions between the first cathode material and the second cathode material.

11. The apparatus for estimating a SOC of a secondary battery according to claim 10,
  wherein when the secondary battery is in a no-load state, the voltage of the secondary battery changes to follow a voltage relaxation profile originating from the voltage relaxation phenomenon.

12. The apparatus for estimating a SOC of a secondary battery according to claim 11,
  wherein the key-on discharge voltage is a voltage selected from a voltage change pattern which appears while a voltage of the secondary battery is dropped and then returns to the voltage relaxation profile during the key-on discharge.

13. The apparatus for estimating a SOC of a secondary battery according to claim 12, wherein the key-on discharge voltage is a voltage measured when the key-on discharge is completed, a voltage measured when a predetermined time passes after the key-on discharge starts, a voltage measured when a predetermined time passes after the key-on discharge is completed, a voltage measured when the voltage of the secondary battery returns to the voltage relaxation profile, a voltage measured when a minimum point is formed in a voltage change pattern of the secondary battery formed by the key-on discharge, or a voltage measured when the change of voltage per unit time is greatest in the voltage change pattern of the secondary battery formed by the key-on discharge.

14. The apparatus for estimating a SOC of a secondary battery according to claim 1, further comprising a display unit for displaying the estimated SOC as a graphic interface,
  wherein the control unit is configured to output the estimated SOC to the display unit.

15. The apparatus for estimating a SOC of a secondary battery according to claim 1, further comprising a storage unit in which the estimated SOC is stored,
  wherein the control unit is configured to store the estimated SOC in the storage unit.

16. The apparatus for estimating a SOC of a secondary battery according to claim 1,
  wherein the control unit is configured to output the estimated SOC to the outside.

17. An apparatus for estimating a SOC of a secondary battery, which includes a cathode having a blended cathode material containing a first cathode material and a second cathode material with different operating voltage ranges, an anode having an anode material, and a separator for separating the cathode from the anode, the apparatus comprising:
  a sensor configured to measure a discharge inception voltage and a final discharge voltage when the secondary battery is discharged for a predetermined time before the voltage of the secondary battery in a no-load state reaches an equilibrium state voltage; and
  a control unit configured to estimate a SOC of the secondary battery corresponding to the measured discharge inception voltage and the measured final discharge voltage by using a predetermined relationship between the discharge inception voltage and the final discharge voltage and the SOC of the secondary battery.

18. An apparatus for estimating a SOC of a secondary battery, comprising:
  a sensor configured to measure a discharge inception voltage and a final discharge voltage of the secondary battery when the secondary battery is discharged for a predetermined time before the voltage of the secondary battery in a no-load state reaches an equilibrium state voltage; and
  a control unit configured to estimate a SOC of the secondary battery corresponding to the measured discharge inception voltage and the measured final discharge voltage by using a predetermined relationship between the discharge inception voltage and the final discharge voltage and the SOC of the secondary battery.

19. A method for estimating a SOC of a secondary battery, which includes a cathode having a blended cathode material containing a first cathode material and a second cathode material with different operating voltage ranges, an anode having an anode material, and a separator for separating the cathode from the anode, the method comprising:

measuring a discharge inception voltage and a final discharge voltage when the secondary battery is discharged for a predetermined time; and estimating a SOC of the secondary battery corresponding to the measured discharge inception voltage and the measured final discharge voltage by using a predetermined relationship between the discharge inception voltage and the final discharge voltage and the SOC of the secondary battery, wherein the relationship is predetermined by applying a discharge condition when the secondary battery is discharged for a predetermined time.

20. The method for estimating a SOC of a secondary battery according to claim 19, wherein the discharge inception voltage is a key-on voltage measured right after the secondary battery in a no-load state comes to a key-on state, and wherein the final discharge voltage is a key-on discharge voltage measured after the secondary battery in the key-on state performs key-on discharge for a predetermined time.

21. The method for estimating a SOC of a secondary battery according to claim 20, wherein in the step of estimating a SOC, the SOC of the secondary battery is estimated using a look-up table in which a relationship between the key-on voltage and the key-on discharge voltage of the secondary battery and the SOC is predetermined.

22. The method for estimating a SOC of a secondary battery according to claim 20, wherein in the step of estimating a SOC, the SOC of the secondary battery is estimated using a look-up function which uses the key-on voltage and the key-on discharge voltage as input parameters and the SOC as an output parameter.

23. The method for estimating a SOC of a secondary battery according to claim 20, further comprising:

connecting the secondary battery to a discharge unit for the key-on discharge.

24. The method for estimating a SOC of a secondary battery according to claim 20, wherein the key-on discharge is automatically performed when the secondary battery comes to a key-on state.

25. The method for estimating a SOC of a secondary battery according to claim 20, further comprising:

the voltage of the secondary battery following a voltage relaxation profile, when the secondary battery is in a no-load state.

26. The method for estimating a SOC of a secondary battery according to claim 25, wherein the key-on discharge voltage is measured in a time region while a voltage of the secondary battery is dropped and then returns to the voltage relaxation profile during the key-on discharge.

27. The method for estimating a SOC of a secondary battery according to claim 26, wherein the key-on discharge voltage is a voltage measured when the key-on discharge is completed, a voltage measured when a predetermined time passes after the key-on discharge starts, a voltage measured when a predetermined time passes after the key-on discharge is completed, a voltage measured when the voltage of the secondary battery returns to the voltage relaxation profile, a voltage measured when a minimum point is formed in a voltage change pattern of the secondary battery formed by the key-on discharge, or a voltage measured when the change of voltage per unit time is greatest in the voltage change pattern of the secondary battery formed by the key-on discharge.

28. The method for estimating a SOC of a secondary battery according to claim 19, further comprising:

displaying the estimated SOC as a graphic interface.

29. The method for estimating a SOC of a secondary battery according to claim 19, further comprising:

storing the estimated SOC.

30. The method for estimating a SOC of a secondary battery according to claim 19, further comprising:

outputting the estimated SOC to the outside.

31. A method for estimating a SOC of a secondary battery, which includes a cathode having a blended cathode material containing a first cathode material and a second cathode material with different operating voltage ranges, an anode having an anode material, and a separator for separating the cathode from the anode, the method comprising:

measuring a discharge inception voltage and a final discharge voltage when the secondary battery is discharged for a predetermined time before the voltage of the secondary battery in a no-load state reaches an equilibrium state voltage; and estimating a SOC of the secondary battery corresponding to the measured discharge inception voltage and the measured final discharge voltage by using a predetermined relationship between the discharge inception voltage and the final discharge voltage and the SOC of the secondary battery.

32. A method for estimating a SOC of a secondary battery, comprising:

measuring a discharge inception voltage and a final discharge voltage when the secondary battery is discharged for a predetermined time before the voltage of the secondary battery in a no-load state reaches an equilibrium state voltage; and estimating a SOC of the secondary battery corresponding to the measured discharge inception voltage and the measured final discharge voltage by using a predetermined relationship between the discharge inception voltage and the final discharge voltage and the SOC of the secondary battery.

* * * * *